(12) United States Patent
Lee

(10) Patent No.: US 12,029,035 B2
(45) Date of Patent: Jul. 2, 2024

(54) MEMORY DEVICE CAPABLE OF MINIMIZING BRIDGE PHENOMENON OF WORD LINES AND MANUFACTURING METHOD OF THE MEMORY DEVICE

(71) Applicant: SK hynix Inc., Icheon-si Gyeonggi-do (KR)

(72) Inventor: Nam Jae Lee, Icheon-si Gyeonggi-do (KR)

(73) Assignee: SK hynix inc., Icheon-si (KR)

(*) Notice: Subject to any disclaimer, the term of this patent is extended or adjusted under 35 U.S.C. 154(b) by 260 days.

(21) Appl. No.: 17/189,926

(22) Filed: Mar. 2, 2021

(65) Prior Publication Data

US 2022/0093635 A1 Mar. 24, 2022

(30) Foreign Application Priority Data

Sep. 18, 2020 (KR) ........................ 10-2020-0120333

(51) Int. Cl.

| H10B 43/27 | (2023.01) |
| H01L 23/528 | (2006.01) |
| H10B 41/10 | (2023.01) |
| H10B 41/27 | (2023.01) |
| H10B 41/40 | (2023.01) |
| H10B 43/10 | (2023.01) |
| H10B 43/40 | (2023.01) |

(52) U.S. Cl.
CPC ......... *H10B 43/27* (2023.02); *H01L 23/5283* (2013.01); *H10B 41/10* (2023.02); *H10B 41/27* (2023.02); *H10B 41/40* (2023.02); *H10B 43/10* (2023.02); *H10B 43/40* (2023.02)

(58) Field of Classification Search
CPC ........ H10B 43/27; H10B 41/10; H10B 41/40; H10B 43/40; H10B 43/10; H10B 41/27; H01L 23/5283
See application file for complete search history.

(56) References Cited

U.S. PATENT DOCUMENTS

| 9,524,903 B2 | 12/2016 | Lee |
| 10,600,781 B1 | 3/2020 | Xiao et al. |
| 10,790,296 B1 | 9/2020 | Yamaha et al. |
| 11,211,392 B1 | 12/2021 | Puthenthermadam et al. |

(Continued)

*Primary Examiner* — Thao X Le
*Assistant Examiner* — Sean Ayers Winters
(74) *Attorney, Agent, or Firm* — William Park & Associates Ltd.

(57) ABSTRACT

There are provided a memory device and a manufacturing method of the memory device. The memory device includes: a first gate conductive pattern including a first horizontal part and a second horizontal part and a third horizontal part connected to one end portion of the first horizontal part; a first insulating pattern disposed between the first horizontal part and the second horizontal part of the first gate conductive pattern; and a second gate conductive pattern including a first horizontal part and a second horizontal part and a third horizontal part connected to one end portion of the second horizontal part of the second gate conductive pattern; a first gate contact structure extending vertically on a contact region, the first gate contact structure being in contact with the first gate conductive pattern while penetrating the third horizontal part of the first gate conductive pattern.

6 Claims, 27 Drawing Sheets

(56) References Cited

U.S. PATENT DOCUMENTS

| | | |
|---|---|---|
| 2016/0027730 A1* | 1/2016 | Lee .................. H01L 21/76816 |
| | | 257/774 |
| 2019/0081069 A1 | 3/2019 | Lu et al. |
| 2019/0115358 A1* | 4/2019 | Lee ....................... H01L 23/562 |
| 2019/0378857 A1* | 12/2019 | Lee ....................... H10B 41/30 |
| 2019/0393240 A1 | 12/2019 | Kim et al. |
| 2020/0091071 A1 | 3/2020 | Lee et al. |
| 2020/0091185 A1 | 3/2020 | Baek |
| 2020/0152654 A1 | 5/2020 | Hwang et al. |
| 2020/0176464 A1 | 6/2020 | Jang et al. |
| 2020/0185405 A1 | 6/2020 | Cui et al. |
| 2020/0303401 A1 | 9/2020 | Kanamori et al. |
| 2021/0210426 A1 | 7/2021 | Lee |
| 2021/0296337 A1 | 9/2021 | Hagishima et al. |
| 2021/0313281 A1 | 10/2021 | Kaminaga et al. |
| 2021/0375913 A1 | 12/2021 | Zhang |
| 2021/0399018 A1 | 12/2021 | Zhu |
| 2021/0408033 A1 | 12/2021 | Baraskar et al. |
| 2022/0005825 A1 | 1/2022 | Zhang et al. |
| 2022/0037352 A1 | 2/2022 | Zhang et al. |
| 2022/0068956 A1 | 3/2022 | Clampitt et al. |
| 2022/0068957 A1 | 3/2022 | Yeh et al. |

\* cited by examiner

MEMORY DEVICE CAPABLE OF MINIMIZING BRIDGE PHENOMENON OF WORD LINES AND MANUFACTURING METHOD OF THE MEMORY DEVICE

CROSS-REFERENCE TO RELATED APPLICATION

The present application claims priority under 35 U.S.C. § 119(a) to Korean patent application number 10-2020-0120333 filed on Sep. 18, 2020, in the Korean Intellectual Property Office, the entire disclosure of which is incorporated by reference herein.

BACKGROUND

1. Technical Field

The present disclosure generally relates to a memory device and a manufacturing method of the memory device, and more particularly, to a three-dimensional memory device and a manufacturing method of the three-dimensional memory device.

2. Related Art

A memory device includes a memory cell array and a peripheral circuit connected to the memory cell array. The memory cell array includes a plurality of memory cells capable of storing data, and the peripheral circuit is configured to perform a general operation such as a program operation, a read operation, or an erase operation.

In order to improve the degree of integration of the memory device, the memory cell array may include memory cells three-dimensionally arranged above the peripheral circuit.

SUMMARY

In accordance with an aspect of the present disclosure, there may be provided a memory device including: a first gate conductive pattern disposed over the semiconductor substrate to extend horizontally from a cell region to a contact region of the semiconductor substrate, the first gate conductive pattern including a first horizontal part and a second horizontal part, which extend substantially in parallel to each other to the contact region, and a third horizontal part connected to one end portion of the first horizontal part; a first insulating pattern disposed between the first horizontal part and the second horizontal part of the first gate conductive pattern; a second gate conductive pattern disposed substantially in parallel to the first gate conductive pattern under the first gate conductive pattern, the second gate conductive pattern including a first horizontal part and a second horizontal part, which extend substantially in parallel to each other from the cell region to the contact region, and a third horizontal part connected to one end portion of the first horizontal part of the second gate conductive pattern; a first gate contact structure extending vertically over the contact region, the first gate contact structure being in contact with the first gate conductive pattern while penetrating the third horizontal part of the first gate conductive pattern; and a second gate contact structure extending vertically over the contact region, the second gate contact structure being in contact with the second gate conductive pattern while penetrating the first insulating pattern and penetrating the third horizontal part of the second gate conductive pattern, wherein a length of the first gate conductive pattern extending to the contact region is shorter than that of the second gate conductive pattern extending to the contact region.

In accordance with another aspect of the present disclosure, there may be provided a memory device including: a peripheral circuit structure including interconnection structures coupled to a peripheral circuit; a cell stack structure including a plurality of gate conductive patterns, the cell stack structure being stacked on the peripheral circuit structure; and a plurality of gate contact structures respectively connecting the plurality of gate conductive patterns to the interconnection structures, wherein each of the plurality of gate conductive patterns includes a first horizontal part and a second horizontal part, both the first and second horizontal parts extending horizontally from a cell region to a contact region, and a third horizontal part connected to one end of the first horizontal part and one end of the second horizontal part, the third horizontal part being connected to a corresponding gate contact structure among the plurality of gate contact structures.

In accordance with still another aspect of the present disclosure, there may be provided a method of manufacturing a memory device, the method including: forming a peripheral circuit structure including interconnection structures on a substrate including a cell region and a contact region; forming a cell stack structure including a stepped structure including interlayer insulating layers stacked to be spaced apart from each other while surrounding a channel structure and sacrificial layers surrounding the channel structure between the interlayer insulating layers on the peripheral circuit structure; forming gaps in sidewalls of the interlayer insulating layers by etching sidewalls of the sacrificial layers such that the interlayer insulating layers further protrude than the sacrificial layers; forming a first tunnel extending in a first direction in the sidewall of each of the sacrificial layers by forming a gap fill insulating layer on the structure including the stepped structure; exposing the sidewalls of the sacrificial layers and the first tunnel by performing a slit process of etching the gap fill insulating layer and the stepped structure in a second direction substantially perpendicular to the first direction; forming second tunnels by selectively removing the sacrificial layers of the cell region and etching sidewalls of the sacrificial layers of the contact region to a thickness, wherein the second tunnels are connected to the first tunnel and extend in the second direction; and forming gate conductive patterns by filling, with a conductive material, a region in which the sacrificial layers on the cell region are removed and the inside of the first tunnel and the second tunnels on the contact region.

BRIEF DESCRIPTION OF THE DRAWINGS

Examples of embodiments will now be described hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Hereinafter, examples of embodiments of the present disclosure will be described with reference to the accompanying drawings. Some embodiments provide a memory device capable of minimizing a bridge phenomenon of word lines of the memory device and a manufacturing method of the memory device.

Figure 1:
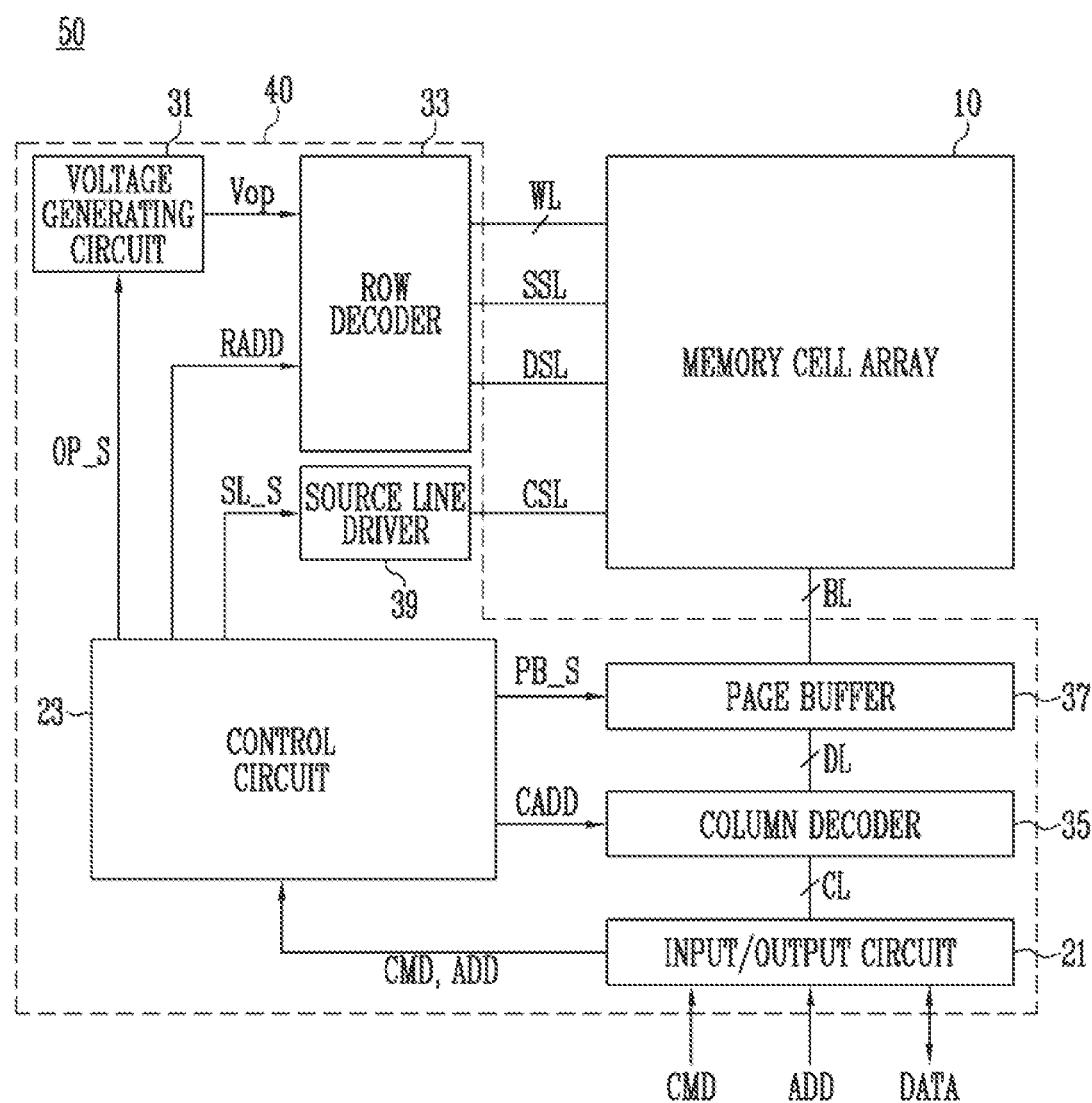
FIG. 1 is a block diagram illustrating a memory device in accordance with an embodiment of the present disclosure.

FIG. 1 is a block diagram illustrating a memory device in accordance with an embodiment of the present disclosure.

Referring to FIG. 1, the memory device 50 may include a peripheral circuit 40 and a memory cell array 10.

The peripheral circuit 40 may be configured to perform a general operation such as a program operation for storing data in the memory cell array 10, a read operation for outputting data stored in the memory cell array 10, or an erase operation for erase data stored in the memory cell array 10. In an embodiment, the peripheral circuit 40 may include an input/output circuit 21, a control circuit 23, a voltage generating circuit 31, a row decoder 33, a column decoder 35, a page buffer 37, and a source line driver 39.

The memory cell array 10 may include a plurality of memory cells in which data is stored. The memory cells may be three-dimensionally arranged. The memory cell array 10 may include one or more cell strings. Each of the cell strings may include at least one drain select transistor, a plurality of memory cells, and at least one source select transistor, which are connected between any one of bit lines BL and a common source line CSL. The at least one drain select transistor may be connected to a drain select line DSL, the plurality of memory cells may be connected to a plurality of word lines WL, and the at least one source select transistor may be connected to a source select line SSL.

The input/output circuit 21 may transfer, to the control circuit 23, a command CMD and an address ADD, which are transferred from an external device (e.g., a memory controller) of the memory device 50. The input/output circuit 21 may transmit data DATA received from the external device to the column decoder 35 or output data DATA received from the column decoder 35 to the external device.

The control logic 23 may control the voltage generating circuit 31, the row decoder 33, the column decoder 35, the page buffer 37, and the source line driver 39 to perform a program operation, a read operation, or an erase operation in response to the command CMD and the address ADD, which are received through the input/output circuit 21. For example, the control circuit 23 may generate and output an operation signal OPS, a row address RADD, a source line control signal SL_S, a page buffer control signal PB_S, and a column address CADD in response to the command CMD and the address ADD.

The voltage generating circuit 31 may generate various operating voltages Vop used for a program operation, a read operation, and an erase operation in response to the operation signal OP_S.

The row decoder 33 may selectively transfer the operating voltages Vop generated by the voltage generating circuit 31 to the drain select line DSL, the word lines WL, and the source select line SSL in response to the row address RADD. Also, the row decoder 33 may selectively discharge voltages of the drain select line DSL, the word lines WL, and the source select line SSL.

The column decoder 35 may transmit data DATA input from the input/output circuit 21 to the page buffer 37 or transmit data DATA stored in the page buffer 37 to the input/output circuit 21 in response to the column address CADD. For example, in a program operation, the column decoder 35 may transmit data DATA received from the input/output circuit 21 through column lines CL to the page buffer 37 in response to the column address CADD. In a read operation, the column decoder 35 may receive data DATA stored in the page buffer 37 through data lines DL, and transmit the received data DATA to the input/output circuit 21.

In a program operation, the page buffer 37 may temporarily store data DATA received from the column decoder 35, and control a potential of the bit lines BL, based on the temporarily stored data DATA. In a read operation, the page buffer 37 may sense a potential or current amount of the bit lines BL, and latch data DATA, based on a sensing result. The page buffer 37 may operate in response to the page buffer control signal PB_S.

The source line driver 39 may control a voltage applied to the common source line CSL in response to the source line control signal SL_S. For example, in an erase operation, the source line driver 39 may apply an erase voltage to the common source line CSL.

In order to improve the degree of integration of the memory device, a cell stack structure of the memory cell array 10 may overlap with the peripheral circuit 40. For example, after a peripheral circuit structure is formed on a substrate, the cell stack structure may overlap with the peripheral circuit structure.

Figure 2A:
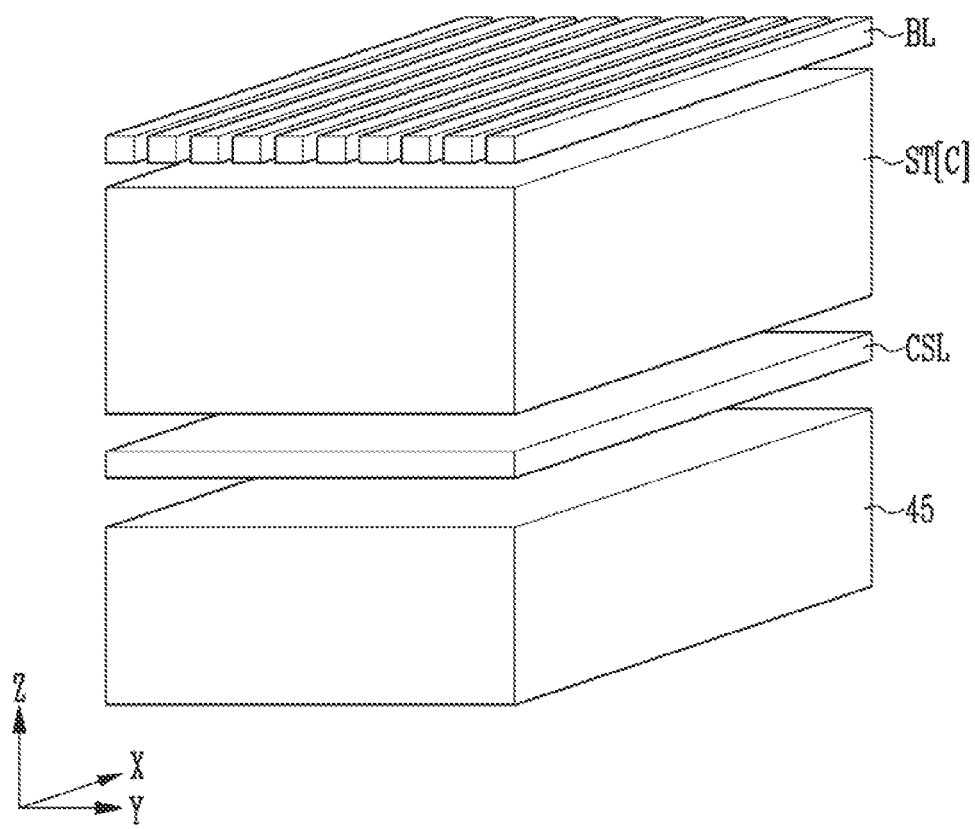
FIGS. 2A and 2B are perspective views illustrating overlapping structures of a peripheral circuit structure and a cell stack structure in accordance with embodiments of the present disclosure.
Figure 2B:
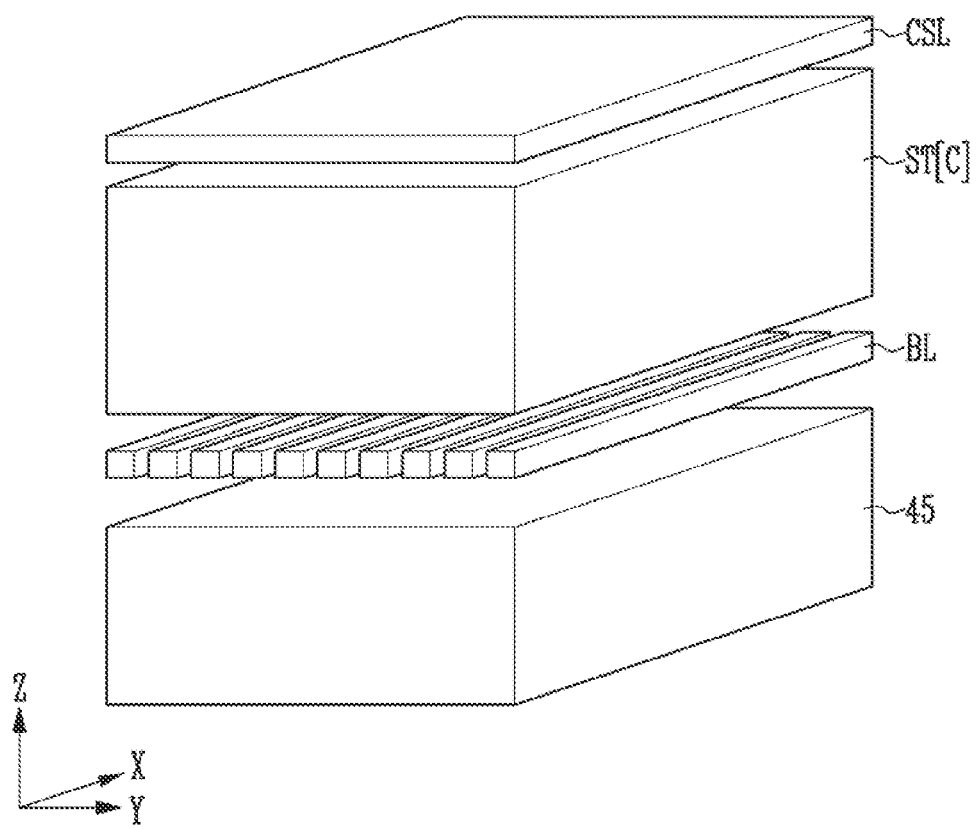

FIGS. 2A and 2B are perspective views illustrating overlapping structures of a peripheral circuit structure and a cell stack structure in accordance with embodiments of the present disclosure.

Referring to FIGS. 2A and 2B, a common source line CSL and a plurality of bit lines BL may overlap with each other above the peripheral circuit structure 45. The cell stack structure ST[C] may be disposed between the common source line CSL and the plurality of bit lines BL.

Referring to FIG. 2A, in an embodiment, the common source line CSL may be disposed between the cell stack structure ST[C] and the peripheral circuit structure 45, and the bit lines BL may overlap with the common source line CSL with the cell stack structure ST[C] interposed therebetween.

Referring to FIG. 2B, in an embodiment, the bit lines BL may be disposed between the cell stack structure ST[C] and the peripheral circuit structure 45. The common source line CSL may overlap with the bit lines BL with the cell stack structure ST[C] interposed therebetween.

In the above-described embodiments of the present disclosure, it is illustrated that the whole of the cell stack structure ST[C] overlaps with the top of the peripheral circuit structure 45. However, only a partial region of the cell stack structure ST[C] may overlap with the top of the peripheral circuit structure 45. That is, a partial region of the cell stack structure ST[C] and a partial region of the peripheral circuit structure 45 may overlap with each other.

Figure 3:
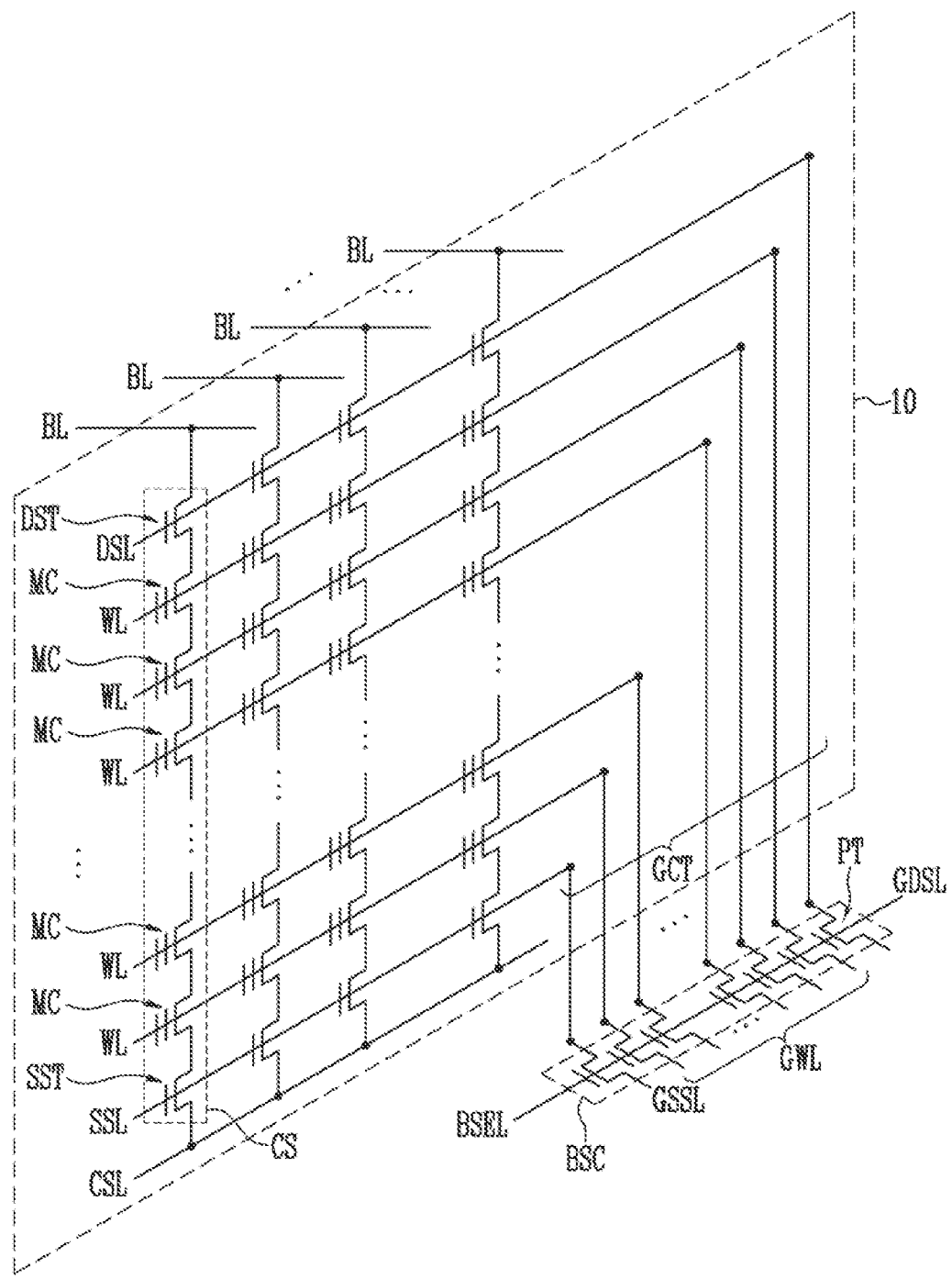
FIG. 3 is a circuit diagram illustrating a memory cell array and a row decoder in accordance with an embodiment of the present disclosure.

FIG. 3 is a circuit diagram illustrating a memory cell array and a row decoder in accordance with an embodiment of the present disclosure.

Referring to FIG. 3, the memory cell array 10 may include a plurality of cell strings CS respectively connected to a plurality of bit lines BL. The plurality of cell strings CS may be commonly connected to a common source line CSL.

Each of the cell strings CS may include at least one source select transistor SST, a plurality of memory cells MC, and at least one drain select transistor DST, which are disposed between the common source line CSL and a bit line BL.

The source select transistor SST may control electrical connection between the cell string CS and the common source line CSL. The drain select transistor DST may control electrical connection between the cell string CS and the bit line BL.

One source select transistor SST may be disposed between the common source line CSL and the plurality of memory cells MC, or two or more source select transistors connected in series may be disposed between the common source line CSL and the plurality of memory cells MC. One drain select transistor DST may be disposed between the bit line BL and the plurality of memory cells MC, or two or more drain select transistors connected in series may be disposed between the bit line BL and the plurality of memory cells MC.

The plurality of memory cells MC may be respectively connected to word lines WL. An operation of the plurality of memory cells MC may be controlled by cell gate signals applied to the word lines WL. The source select transistor SST may be connected to a source select line SSL. An operation of the source select transistor SST may be controlled by a source gate signal applied to the source select line SSL. The drain select transistor DST may be connected to a drain select line DSL. An operation of the drain select transistor DST may be controlled by a drain gate signal applied to the drain select line DSL.

The source select line SSL, the drain select line DSL, and the word lines WL may be connected to a block select circuit BSC. The block select circuit BSC may be included in the row decoder 33 described with reference to FIG. 1. In an embodiment, the block select circuit BSC may include pass transistors PT respectively connected to the source select line SSL, the drain select line DSL, and the word lines WL. Gates of the pass transistors PT may be connected to a block select line BSEL. The pass transistors PT may transfer operating voltages applied to global lines GSSL, GWL, and GDSL to the source select line SSL, the drain select line DSL, and the word lines WL in response to a block select signal applied to the block select line BSEL.

The block select circuit BSC may be connected to the source select line SSL, the drain select line DSL, and the word lines WL via gate contact structures GCT.

Figure 4A:
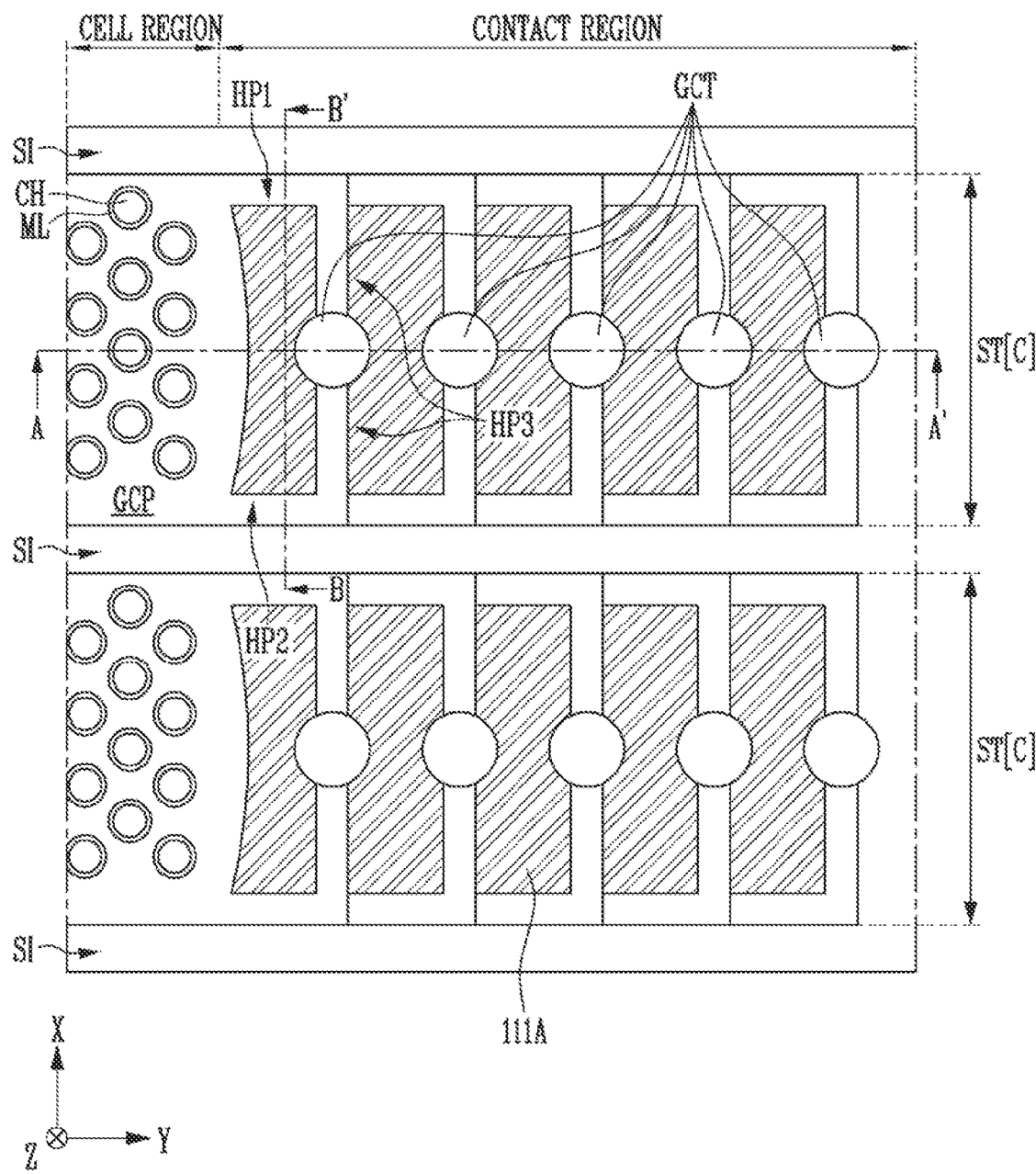
FIG. 4A is a plan view illustrating a cell region and a contact region of a cell stack structure in accordance with an embodiment of the present disclosure.

FIG. 4A is a plan view illustrating a cell region and a contact region of a cell stack structure in accordance with an embodiment of the present disclosure.

Figure 4B:
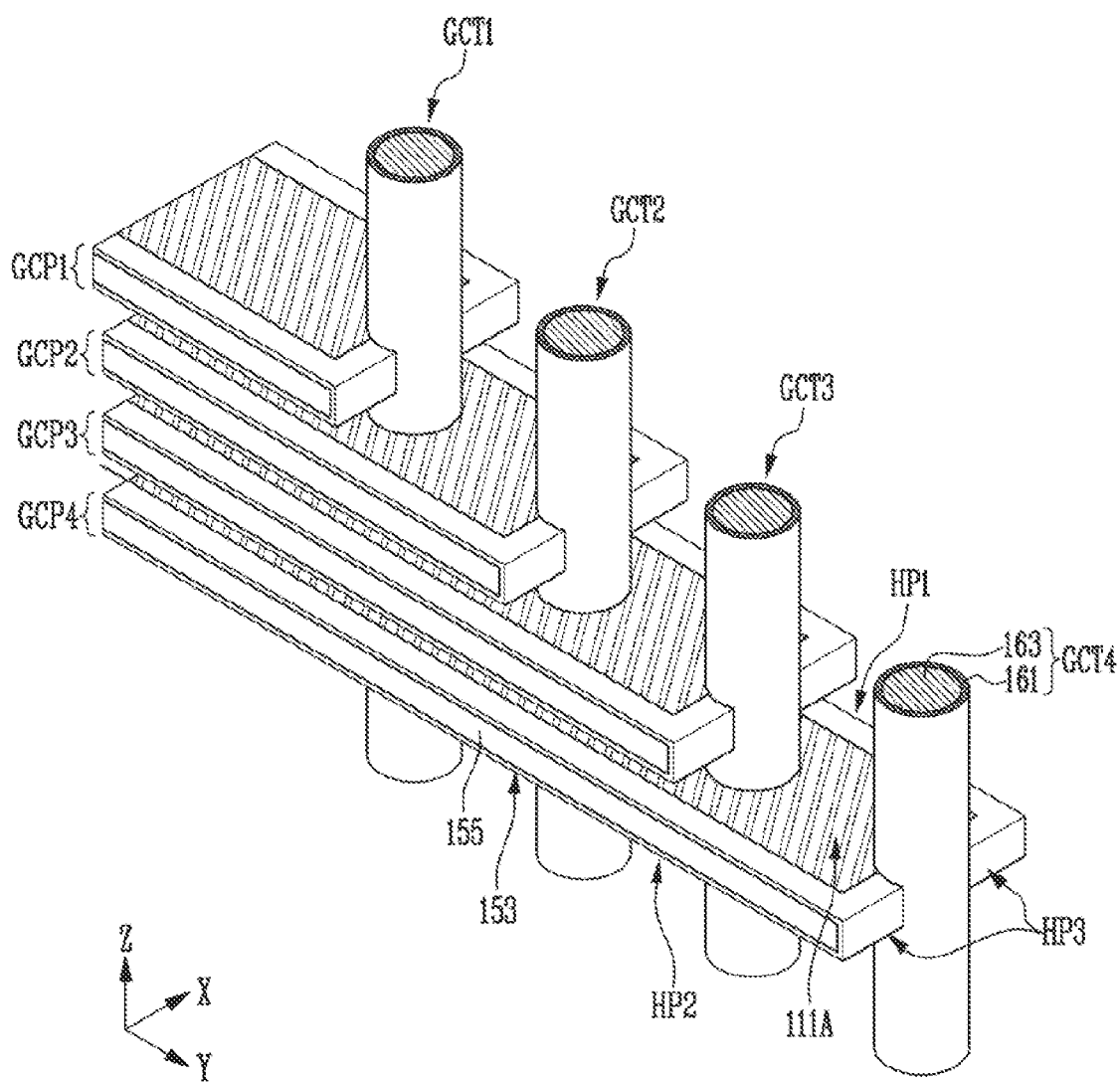
FIG. 4B is a perspective view illustrating a connection structure of gate contact structures and gate conductive patterns in the contact region in accordance with an embodiment of the present disclosure.

FIG. 4B is a perspective view illustrating a connection structure of gate contact structures and gate conductive patterns in the contact region in accordance with an embodiment of the present disclosure.

Referring to FIGS. 4A and 4B, cell stack structures ST[C] may be isolated from each other through a slit SI. The cell stack structures ST[C] may include a cell region and a contact region, and the cell region and the contact region may be disposed adjacent to each other.

Each of the cell stack structures ST[C] may include a plurality of gate conductive patterns GCP stacked to be spaced apart from each other in a third direction Z. Each of the cell stack structures ST[C] may surround a channel structure CH extending in the third direction Z.

The channel structure CH may be formed on the cell region, and a sidewall of the channel structure CH may be surrounded by a memory layer ML. The memory layer ML may include a tunnel insulating layer surrounding the channel structure CH, a data storage layer surrounding the tunnel insulating layer, and a blocking insulating layer surrounding the data storage layer. The data storage layer may be formed as a material layer capable of storing data changed using Fowler-Nordheim tunneling. In an embodiment, the data storage layer may be formed as a charge trap nitride layer. The blocking insulating layer may include an oxide layer capable of blocking charges. The tunnel insulating layer may be formed as a silicon oxide layer through which charges can tunnel.

Each of first to fourth gate conductive patterns GCP1, GCP2, GCP3, and GCP4 may extend along a second direction Y. Each of the first to fourth gate conductive patterns GCP1, GCP2, GCP3, and GCP4 may be sequentially arranged along the third direction Z. A stepped structure may be defined by the first to fourth gate conductive patterns GCP1, GCP2, GCP3, and GCP4. For example, the second gate conductive pattern GCP2 may be disposed in parallel to the first gate conductive pattern GCP1 under the first gate conductive pattern GCP1. The third gate conductive pattern GCP3 may be disposed in parallel to the second gate conductive pattern GCP2 under the second gate conductive pattern GCP2. The fourth gate conductive pattern GCP4 may be disposed in parallel to the third gate conductive pattern GCP3 under the third gate conductive pattern GCP3. An extending length of the first gate conductive pattern GCP1 may be shorter than that of the second gate conductive pattern GCP2, the extending length of the second gate conductive pattern GCP2 may be shorter than that of the third gate conductive pattern GCP3, the extending length of the third gate conductive pattern GCP3 may be shorter than that of the fourth gate conductive pattern GCP4. That is, among the first to fourth gate conductive patterns GCP1, GCP2, GCP3, and GCP4, a gate conductive pattern located at an upper portion may have an extending length shorter than that of a gate conductive pattern located at a lower portion. In an embodiment, the plurality of gate conductive patterns (i.e., GCP1 to GCP4) are arranged to be sequentially stacked to form a stepped structure (i.e., as shown in FIG. 4B) wherein lengths of the first and second horizontal parts of each gate conductive pattern located further from the peripheral circuit structure 45 are shorter than lengths of the first and second horizontal parts of each gate conductive pattern located closer to the peripheral circuit structure.

The first to fourth gate conductive patterns GCP1, GCP2, GCP3, and GCP4 may be respectively in contact with first to fourth gate contact structures GCT1, GCT2, GCT3, and GCT4. Each of the first to fourth gate contact structures GCT1, GCT2, GCT3, and GCT4 may include a first horizontal part HP1 and a second horizontal part HP2, which extend to the contact region, and a third horizontal part HP3 extending toward a corresponding gate contact structure among the first to fourth gate contact structures GCT1, GCT2, GCT3, and GCT4 at one end portion of the first horizontal part HP1 and one end portion of the second horizontal part HP2. That is, the third horizontal part HP3 may connect the one end portion of the first horizontal part HP1 and the corresponding gate contact structure (e.g., GCT1), and connect the one end portion of the second horizontal part HP2 and the corresponding gate contact structure (e.g., GCT1). The first horizontal part HP1 and the second horizontal part HP2 may extend in parallel to each other along the second direction Y. The first horizontal part HP1, the second horizontal part HP2, and the third horizontal part HP3 may include a metal layer 155 and a conductive barrier layer 153 surrounding a surface of the metal layer 155. Among the first to fourth gate conductive patterns GCP1, GCP2, GCP3, and GCP4, a length of a first horizontal part HP1 and a second horizontal part HP2 of a gate conductive pattern disposed at an upper portion may be shorter than that of a first horizontal part HP1 and a second horizontal part HP2 of a gate conductive pattern disposed at a lower portion. For example, a length of a first horizontal part HP1 and a second horizontal part HP2 of the first gate conductive pattern GCP1 is shorter than that of a first horizontal part HP1 and a second horizontal part HP2 of the second gate conductive pattern GCP2. The length of the first horizontal part HP1 and the second horizontal part HP2 of the second gate conductive pattern GCP2 is shorter than that of a first horizontal part HP1 and a second horizontal part HP2 of the third gate conductive pattern GCP3. The length of the first horizontal part HP1 and the second horizontal part HP2 of the third gate conductive pattern GCP3 is shorter than that of a first horizontal part HP1 and a second horizontal part HP2 of the fourth gate conductive pattern GCP4.

An insulating pattern 111A may be disposed between the first horizontal part HP1 and the second horizontal part HP2, and some gate contact structures among the first to fourth gate contact structures GCT1, GCT2, GCT3, and GCT4 may extend in the third direction Z while penetrating the insulating pattern 111A. The insulating pattern 111A may be disposed in the same layer as a corresponding gate conductive pattern.

For example, the first gate contact structure GCT1 corresponding to the first gate conductive pattern GCP1 extends in the third direction Z while penetrating a third horizontal part HP3 of the first gate conductive pattern GCP1. The first gate contact structure GCT1 penetrates an insulating pattern 111A disposed between the first horizontal part HP1 and the second horizontal part HP2 of the second gate conductive pattern GCP2, an insulating pattern 111A disposed between the first horizontal part HP1 and the second horizontal part HP2 of the third gate conductive pattern GCP3, and an insulating pattern 111A disposed between the first horizontal part HP1 and the second horizontal part HP2 of the fourth gate conductive pattern GCP4.

The second gate contact structure GCT2 corresponding to the second gate conductive pattern GCP2 extends in the third direction Z while penetrating a third horizontal part HP3 of the second gate conductive pattern GCP2. The second gate contact structure GCT2 penetrates the insulating pattern 111A disposed between the first horizontal part HP1 and the second horizontal part HP2 of the third gate conductive pattern GCP3 and the insulating pattern 111A disposed between the first horizontal part HP1 and the second horizontal part HP2 of the fourth gate conductive pattern GCP4.

The third gate contact structure GCT3 corresponding to the third gate conductive pattern GCP3 extends in the third direction Z while penetrating a third horizontal part HP3 of the third gate conductive pattern GCP3. The third gate contact structure GCT3 penetrates the insulating pattern 111A disposed between the first horizontal part HP1 and the second horizontal part HP2 of the fourth gate conductive pattern GCP4.

The fourth gate contact structure GCT4 corresponding to the fourth gate conductive pattern GCP4 extends in the third direction Z while penetrating a third horizontal part HP3 of the fourth gate conductive pattern GCP4.

Each of the first to fourth gate contact structures GCT1 to GCT4 vertically extends while penetrating insulating patterns 111A corresponding to a gate conductive pattern disposed downwardly from a corresponding gate conductive pattern. Also, each of the first to fourth gate contact structures GCT1 to GCT4 vertically extends in an external region of gate conductive patterns disposed upwardly of a corresponding gate conductive pattern.

According to the above-described structure, the fourth gate contact structure GCT4 vertically extends to the outside of the first to third gate conductive patterns GCP1, GCP2, and GCP3 to not be in contact with the first to third gate conductive patterns GCP1, GCP2, and GCP3. The third gate contact structure GCT3 vertically extends to the outside of the first and second gate conductive patterns GCP1 and GCP2 to not be in contact with the first and second gate conductive patterns GCP1 and GCP2 and is electrically and physically spaced part from the fourth gate conductive pattern GCP4 by the insulating pattern 111A penetrated thereby. The second gate contact structure GCT2 vertically extends to the outside of the first gate conductive pattern GCP1 to not be in contact with the first gate conductive pattern GCP1 and is electrically and physically spaced apart from the third and fourth gate conductive patterns GCP3 and GCP4 by the insulating patterns 111A penetrated thereby. The first gate contact structure GCT1 is electrically and physically spaced apart from the second to fourth gate conductive patterns GCP2, GCP3, and GCP4 by the insulating patterns 111A penetrated thereby.

The first to fourth gate conductive patterns GCP1, GCP2, GCP3, and GCP4 respectively correspond to the first to fourth gate contact structures GCT1, GCT2, GCT3, and GCT4, and the first to fourth gate contact structures GCT1, GCT2, GCT3, and GCT4 are respectively 1o connected to the third horizontal parts HP3 of the first to fourth gate conductive patterns GCP1, GCP2, GCP3, and GCP4. The first to fourth gate contact structures GCT1, GCT2, GCT3, and GCT4 may be disposed to be spaced apart from each other at a constant distance along the second direction Y. Each of the first to fourth gate contact structures GCT1, GCT2, GCT3, and GCT4 may include a conductive structure 163 and a conductive barrier layer 161 surrounding the conductive structure 163.

Figure 4C:
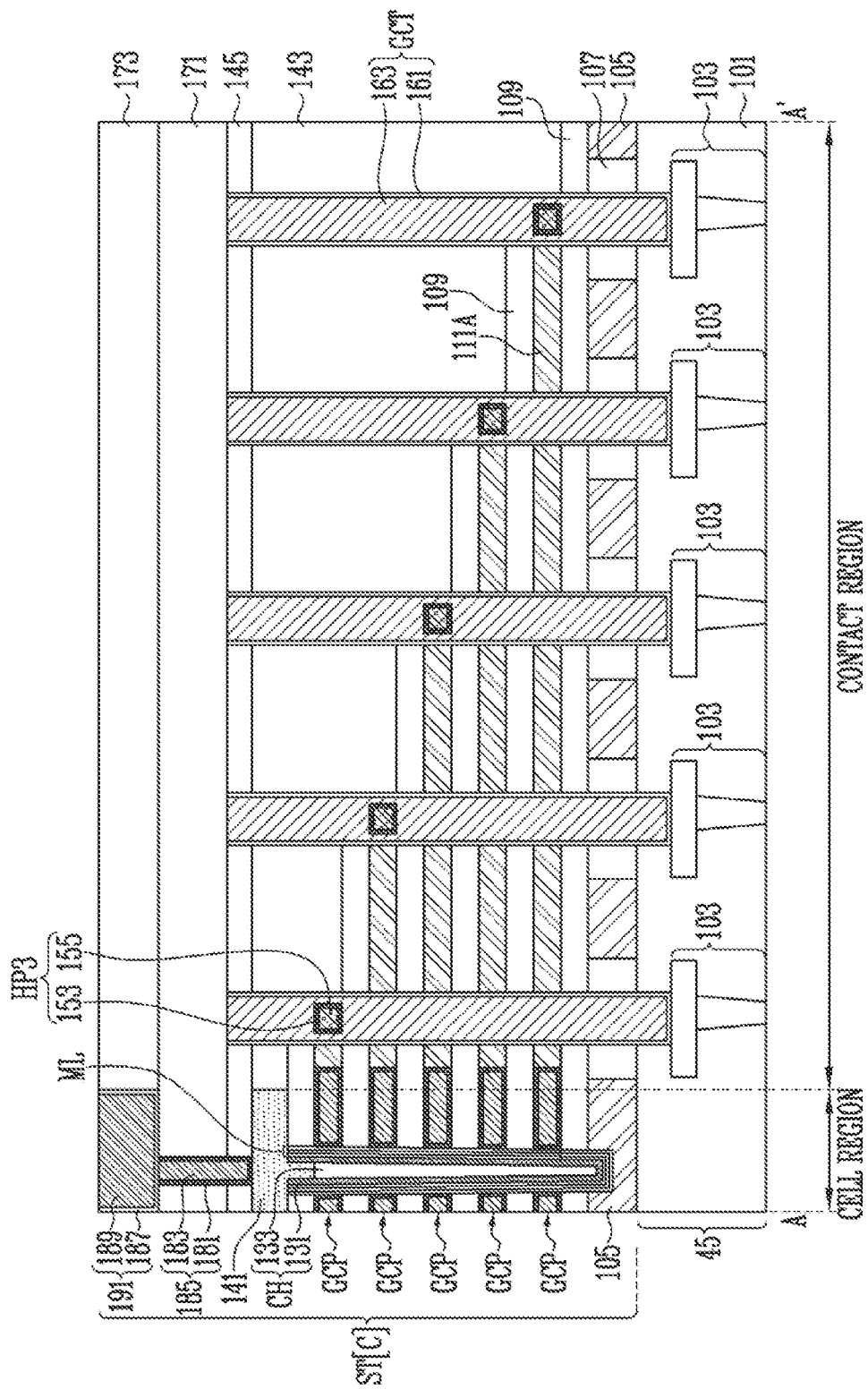
FIG. 4C is a sectional view illustrating a peripheral circuit structure and a cell stack structure in accordance with an embodiment of the present disclosure.

FIG. 4C is a sectional view illustrating a peripheral circuit structure and a cell stack structure in accordance with an embodiment of the present disclosure.

FIG. 4C is a sectional view of a memory device taken along line A-A' shown in FIG. 4A.

Referring to FIG. 4C, the memory device may include a peripheral circuit structure 45 and a cell stack structure ST[C] disposed on the peripheral circuit structure 45. The cell stack structure ST[C] may include a channel structure CH extending vertically. The memory device may further include gate contact structures GCT connecting the peripheral circuit structure 45 and the cell stack structure ST[C]. For example, the peripheral circuit structure 45 and the cell stack structure ST[C] are stacked on a substrate to overlap with each other, and each of the gate contact structures GCT electrically connect any one of gate conductive patterns GCP of the cell stack structure ST[C] and any one of interconnection structures 103 of the peripheral circuit structure 45.

The peripheral circuit structure 45 may include an insulating structure 101 formed on the substrate including a cell region and a contact region, and a plurality of interconnection structures 103 formed in the insulating structure 101. For example, the plurality of interconnection structures 103 may be disposed on the contact region. The plurality of interconnection structures 103 may be connected to the pass transistors PT described with reference to FIG. 3.

A doped semiconductor layer 105 may be formed on the insulating structure 101. The doped semiconductor layer 105 may include at least one of an n-type dopant and a p-type dopant. In an embodiment, the doped semiconductor layer 105 may include an n-type doped silicon layer.

The doped semiconductor layer 105 may be penetrated by the insulating layers 107. The insulating layers 107 may be penetrated by the gate contact structures GCT.

The channel structure CH may extend in the third direction Z, and a channel layer 131 and a core insulating layer 133. The channel layer 131 may surround a sidewall of the core insulating layer 133.

The channel layer 131 may be used as a channel region of a cell string. The channel layer 131 may include a semiconductor layer. In an embodiment, the channel layer 131 may include silicon. The channel layer 131 may further protrude toward the peripheral circuit structure 45 than the core insulating layer 133. The channel layer 131 may be connected to the doped semiconductor layer 105.

A doped semiconductor layer 141 may be formed on the top of the channel structure CH to overlap with the channel structure CH. In an embodiment, the doped semiconductor layer 141 may include an n-type doped silicon layer. An upper conductive layer 191 may overlap with the doped semiconductor layer 141 with the channel structure CH interposed therebetween. The upper conductive layer 191 may include a conductive barrier layer 187 and a conductive pattern 189. The conductive barrier layer 187 may extend along a sidewall and a bottom surface of the conductive pattern 189.

The upper conductive layer 191 may be connected to the channel layer 131 via a channel contact structure 185. The channel contact structure 185 may penetrate a memory layer ML to be in contact with the channel layer 131. The channel contact structure 185 may include a conductive barrier layer 181 and a conductive pattern 183. The conductive barrier layer 181 of the channel contact structure 185 may be disposed between the channel layer 131 and the conductive pattern 183 of the channel contact structure 185, and extend along a sidewall of the conductive pattern 183. In an embodiment, the conductive barrier layer 181 may include titanium and titanium nitride, which can provide an ohmic contact.

A portion of the channel layer 131, which is in contact with the doped semiconductor layer 105, and a portion of the channel layer 131, which is adjacent to the channel contact structure 185, may be doped with an impurity. In an embodiment, a portion of the channel layer 131, which is in contact with the doped semiconductor layer 105, and a portion of the channel layer 131, which is adjacent to the channel contact structure 185, may be doped with an n-type impurity.

The doped semiconductor layer 105 may be used as the common source lien CSL shown in FIG. 3, and the upper conductive layer 191 may be used as the bit line BL shown in FIG. 3. Although a structure corresponding to the embodiment shown in FIG. 2B is exemplified in FIG. 4C, the present disclosure is not limited thereto. In an embodiment, the doped semiconductor layer 105 may be replaced with a conductive pattern for the common source line CSL shown in FIG. 2A, and the upper conductive layer 191 may be defined as a conductive pattern for the bit line BL shown in FIG. 2A.

The gate conductive patterns GCP and interlayer insulating layers 109 of the cell stack structure ST[C] may surround the channel structure CH and extend toward the gate contact structures GCT. The gate conductive patterns GCP are disposed between the interlayer insulating layers 109 adjacent to each other in the third direction Z, to be insulated from each other by the interlayer insulating layers 109. The gate conductive patterns GCP may be used as the source select line SSL, the drain select line DSL, and the word line WL, which are described with reference to FIG. 3. An insulating pattern 111A may be disposed between a region surrounding the channel structure CH of each of the gate conductive patterns GCP and a region connected to a corresponding gate contact structure GCT.

The gate conductive patterns GCP may include various conductive materials. In an embodiment, each of the gate conductive patterns GCP may include a conductive barrier layer 153 and a metal layer 155. The conductive barrier layer 153 may extend along a top surface, a bottom surface, and sidewalls of the metal layer 155.

The cell stack structure ST[C] may include a stepped structure. A gap fill insulating layer 143 may be disposed on the stepped structure of the cell stack structure ST[C], and an insulating layer 145 may be formed on the gap fill insulating layer 143. The insulating layer 145 and the gap fill insulating layer 143 may be penetrated by the gate contact structures GCT.

The gate conductive patterns GCP may be respectively connected to the gate contact structures GCT. Each of the gate contact structures GCT may include a conductive barrier layer 161 and a conductive structure 163. The gate contact structures GCT may be respectively in contact with third horizontal parts HP3 of the gate conductive patterns GCP. The gate contact structures GCT may extend in the third direction Z to penetrate the insulating layer 145, the gap fill insulating layer 143, the insulating layers 107, and the insulating structure 101. Portions of sidewalls of the gate contact structures GCT may be surrounded by the insulating pattern 111A. For example, the gate contact structures GCT are physically and electrically isolated from each other by gate conductive patterns GCP disposed under a corresponding gate conductive pattern GCP and the insulating pattern 111A.

A first upper insulating layer 171 and a second upper insulating layer 173 may be formed on the insulating layer 145 and the gate contact structures GCT. The channel contact structure 185 may be formed while penetrating the first upper insulating layer 171 and the insulating layer 145, and the upper conductive layer 191 may be formed while penetrating the second upper insulating layer 173.

The gate conductive patterns GCP extends more distant from the channel structure CH as coming closer to the peripheral circuit structure 45, thereby forming the stepped structure.

FIGS. 5 to 11, 12A, 12B, 13A, 13B, 14, 15A, 15B, 16A, 16B, and 17 to 19 are views illustrating a method of manufacturing a memory device in accordance with an embodiment of the present disclosure.

The method of manufacturing the memory device in accordance with the embodiment of the present disclosure will be described as follows.

Figure 5:
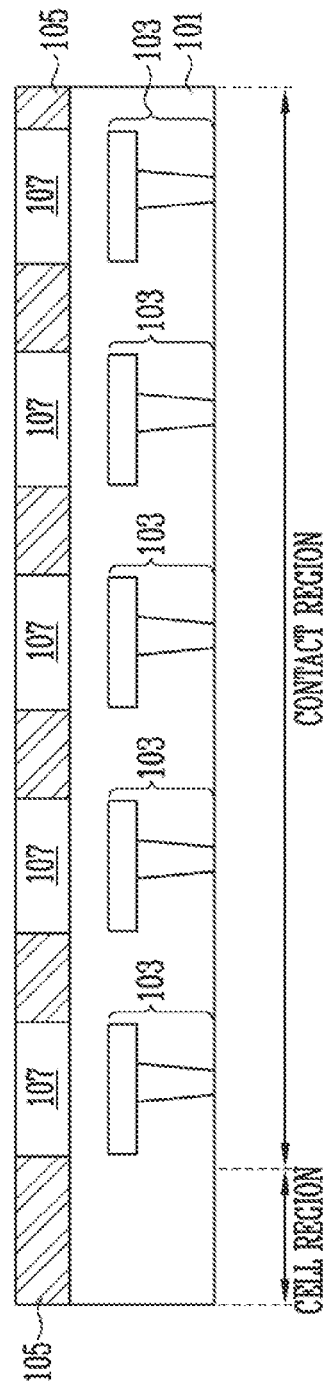
FIGS. 5, 6, 7, 8, 9, 10, 11, 12A, 12B, 13A, 13B, 14, 15A, 15B, 16A, 16B, and 17 to 19 are views illustrating a method of manufacturing a memory device in accordance with an embodiment of the present disclosure.

Referring to FIG. 5, interconnection structures 103 electrically connected to a peripheral circuit and an insulating structure 101 covering the interconnection structures 103 are formed on a substrate in which the peripheral circuit is formed. The peripheral circuit may correspond to the peripheral circuit 40 described with reference to FIG. 1. The substrate may be divided into a cell region and a contact region. The interconnection structures 103 may be formed on the contact region. The interconnection structures 103 may be formed of various conductive materials to be electrically connected to the peripheral circuit 40 described with reference to FIG. 1, and include various configurations. For example, the interconnection structures 103 may be electrically connected to the pass transistors PT include in the block select circuit BSC of the row decoder 33 described with reference to FIGS. 1 and 3.

Subsequently, a doped semiconductor layer 105 is formed on the insulating structure 101. The doped semiconductor layer 105 may be formed to include any one of an n-type dopant and a p-type dopant. In an embodiment, the doped semiconductor layer 105 may be formed to include an n-type doped silicon layer.

Subsequently, the insulating structure 101 over the interconnection structures 103 is exposed by etching the doped semiconductor layer 105 formed on the contact region. Subsequently, insulating layers 107 are formed on the exposed insulating structure 101. That is, the doped semiconductor layer 105 formed above the interconnection structures 103 are etched and removed, and the insulating layers 107 are formed in spaces in which the doped semiconductor layer 105 is removed.

Figure 6:
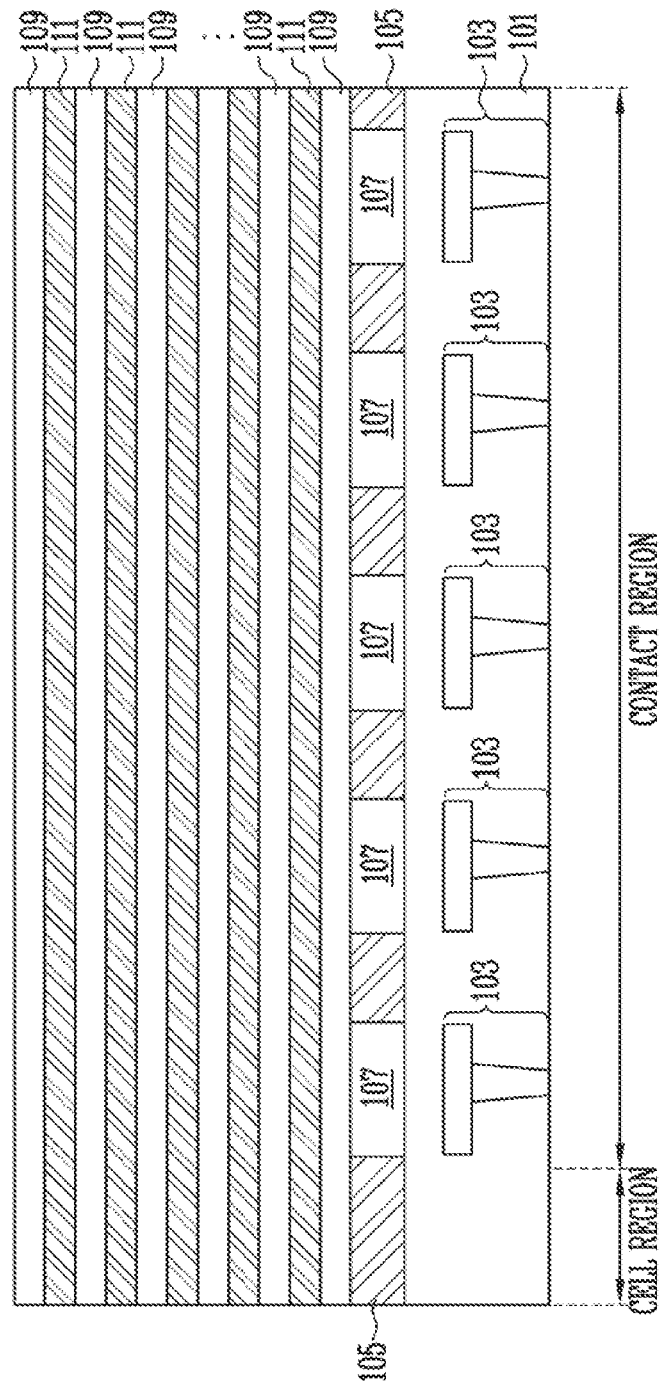

Referring to FIG. 6, interlayer insulating layers 109 and sacrificial layers 111 may be alternately stacked on the entire structure including the doped semiconductor layer 105 and the insulating layers 107. The sacrificial layers 111 may include a material having an etch selectivity with respect to the interlayer insulating layers 109. The sacrificial layers 111 may be formed of an insulating material capable of insulating gate conductive patterns and gate contact structures, which are formed in a subsequent process. The interlayer insulating layers 109 may be formed of an insulating material capable of insulating between the gate conductive patterns. In an embodiment, the interlayer insulating layers 109 may include an oxide layer such as silicon oxide, and the sacrificial layers 111 may include a nitride layer such as silicon nitride.

Figure 7:
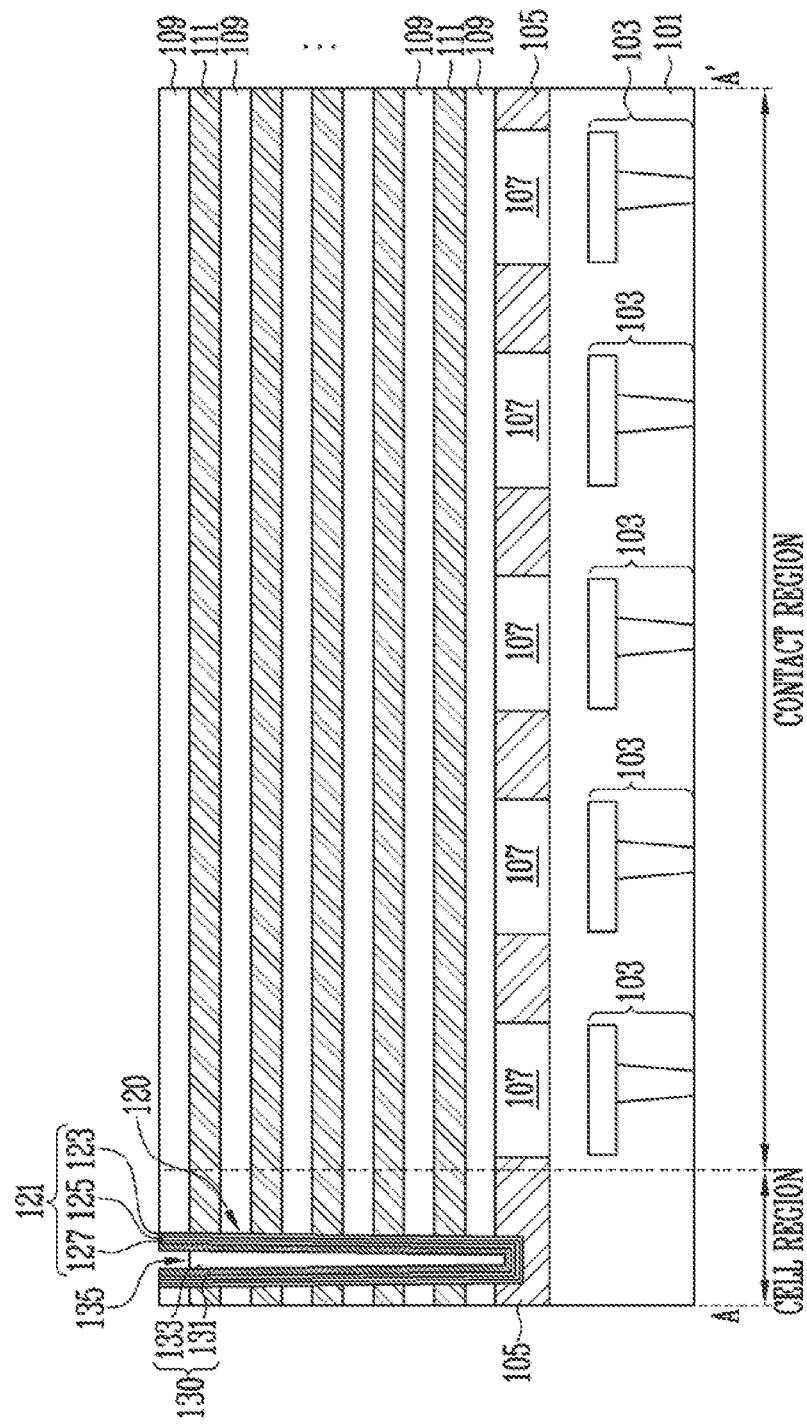

Referring to FIG. 7, the interlayer insulating layers 109 and the sacrificial layers 111 in the cell region may be etched, thereby forming a channel hole 120 penetrating the interlayer insulating layers 109 and the sacrificial layers 111. During the etching process of the interlayer insulating layers 109 and the sacrificial layers 111 for channel hole 120, the doped semiconductor layer 105 may serve as an etch stop layer. After the interlayer insulating layers 109 and the sacrificial layers 111 are etched, the channel hole 120 may extend to the inside of the doped semiconductor layer 105 by etching a portion of the doped semiconductor layer 105.

Subsequently, the channel hole 120 may be filled with a memory layer 121 and a channel structure 130. The memory layer 121 may be formed by sequentially stacking a blocking insulating layer 123, a data storage layer 125, and a tunnel insulating layer 127 on a surface of the channel hole 120. The process of forming the channel structure 130 may include a process of forming a channel layer 131 on a surface of the memory layer 121, a process of filling a central region of the channel hole 120, which is opened by the channel layer 131, with a core insulating layer 133, and a process of removing a portion of the core insulating layer 133 such that a recess region 135 is defined on the top of the core insulating layer 133. The channel layer 131 may include a semiconductor layer which can be used as a channel region of a memory string.

The channel structure 130 may penetrate the interlayer insulating layers 109 and the sacrificial layers 111, and be spaced apart from the interlayer insulating layers 109 and the sacrificial layers 111 through the memory layer 121.

Figure 8:
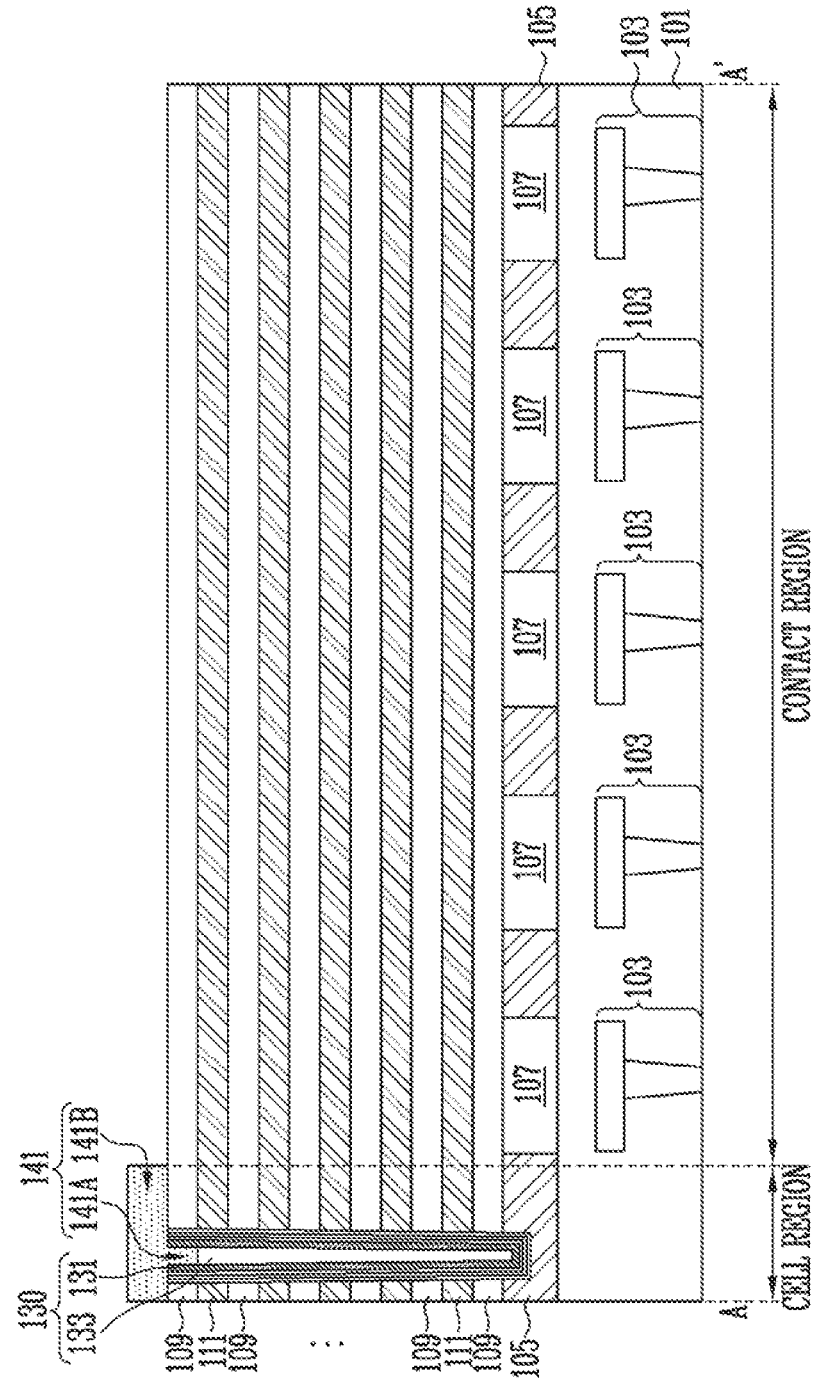

Referring to FIG. 8, a doped semiconductor layer 141 may be formed, which is connected to the channel structure 130. The doped semiconductor layer 141 may include a first pattern 141A filling the recess region 135 shown in FIG. 7 and a second pattern 141B extending from the first pattern 141A. The second pattern 141B may extend to cover a portion of the stacked structure of the interlayer insulating layers 109 and the sacrificial layers 111.

Figure 9:
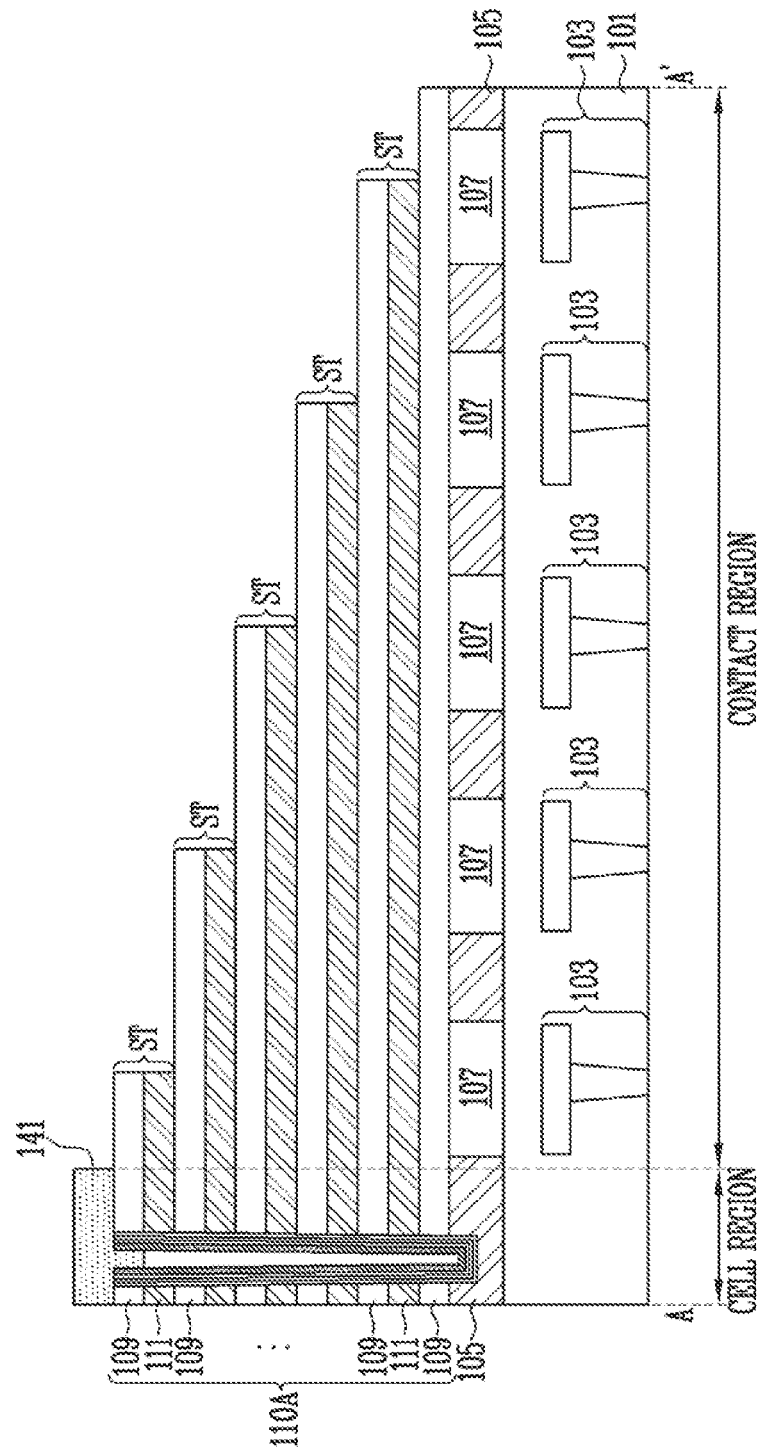

Referring to FIG. 9, the interlayer insulating layers 109 and the sacrificial layers 111, which are exposed by the doped semiconductor layer 141, may be etched, thereby forming a preliminary stepped structure 110A. The preliminary stepped structure 110A may include a plurality of steps ST. Each step ST may include a sacrificial layer 111 and an interlayer insulating layer 109 on the sacrificial layer 111.

Figure 10:
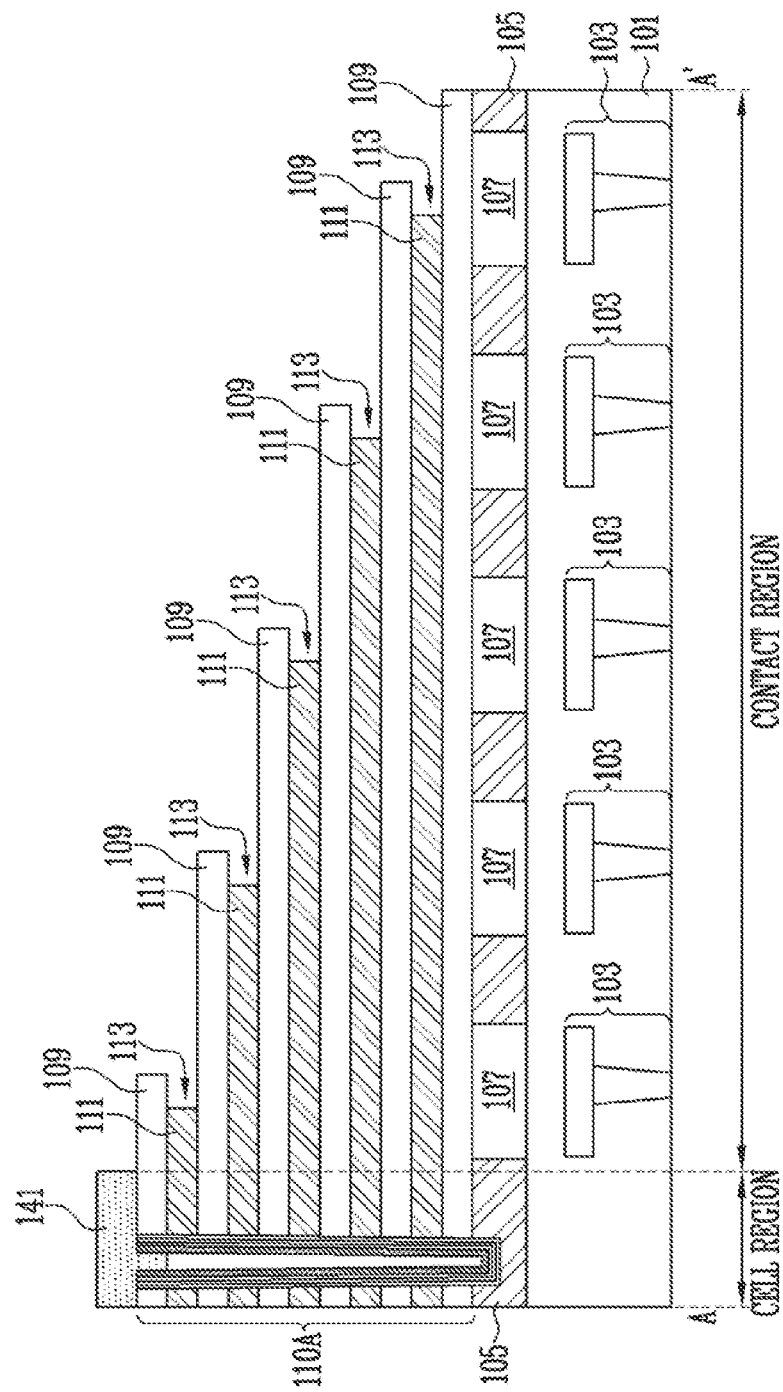

Referring to FIG. 10, a portion of each of the sacrificial layers 111 may be selectively etched from a sidewall of the preliminary stepped structure 110A. Accordingly, gaps 113 may be defined between the interlayer insulating layers 109.

Figure 11:
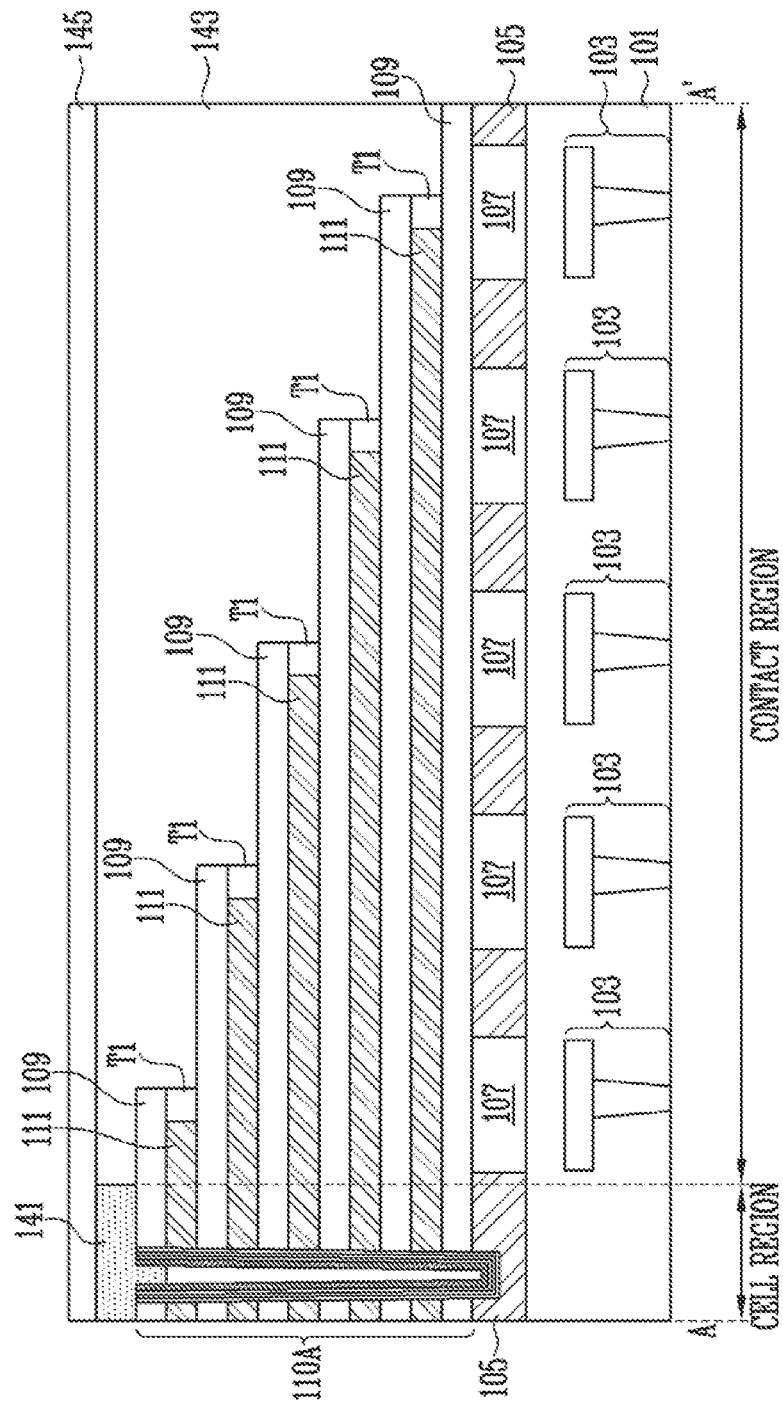

Referring to FIG. 11, a gap fill insulating layer 143 is formed on the entire structure including the preliminary stepped structure 110A and the doped semiconductor layer 141. The gap fill insulating layer 143 may be formed of a material having a low step coverage such that the gaps 113 shown in FIG. 10 are not buried. Therefore, a first tunnel T1 is formed at an end portion of each of the sacrificial layers 111. That is, an air is formed at the inside of the first tunnel T1.

Subsequently, a mask process and an etching process may be performed to partially remove the gap fill insulating layer 143 formed on the cell region, and a planarization process may be performed to expose a surface of the doped semiconductor layer 141.

Subsequently, an Insulating layer 145 may be formed on the doped semiconductor layer 141 and the gap fill insulating layer 143. The insulating layer 145 may be formed as an oxide layer.

Figure 12A:
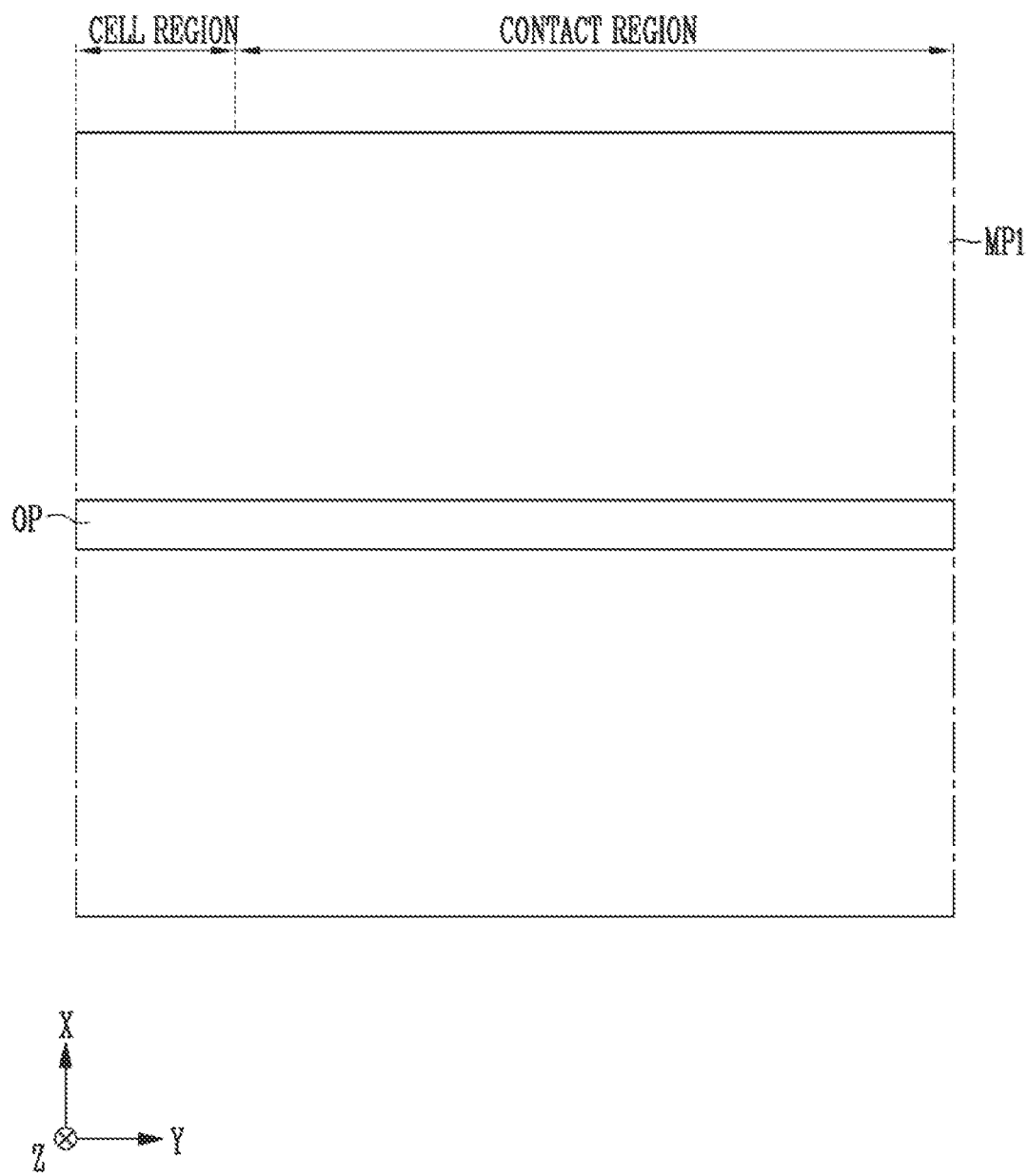
Figure 12B:
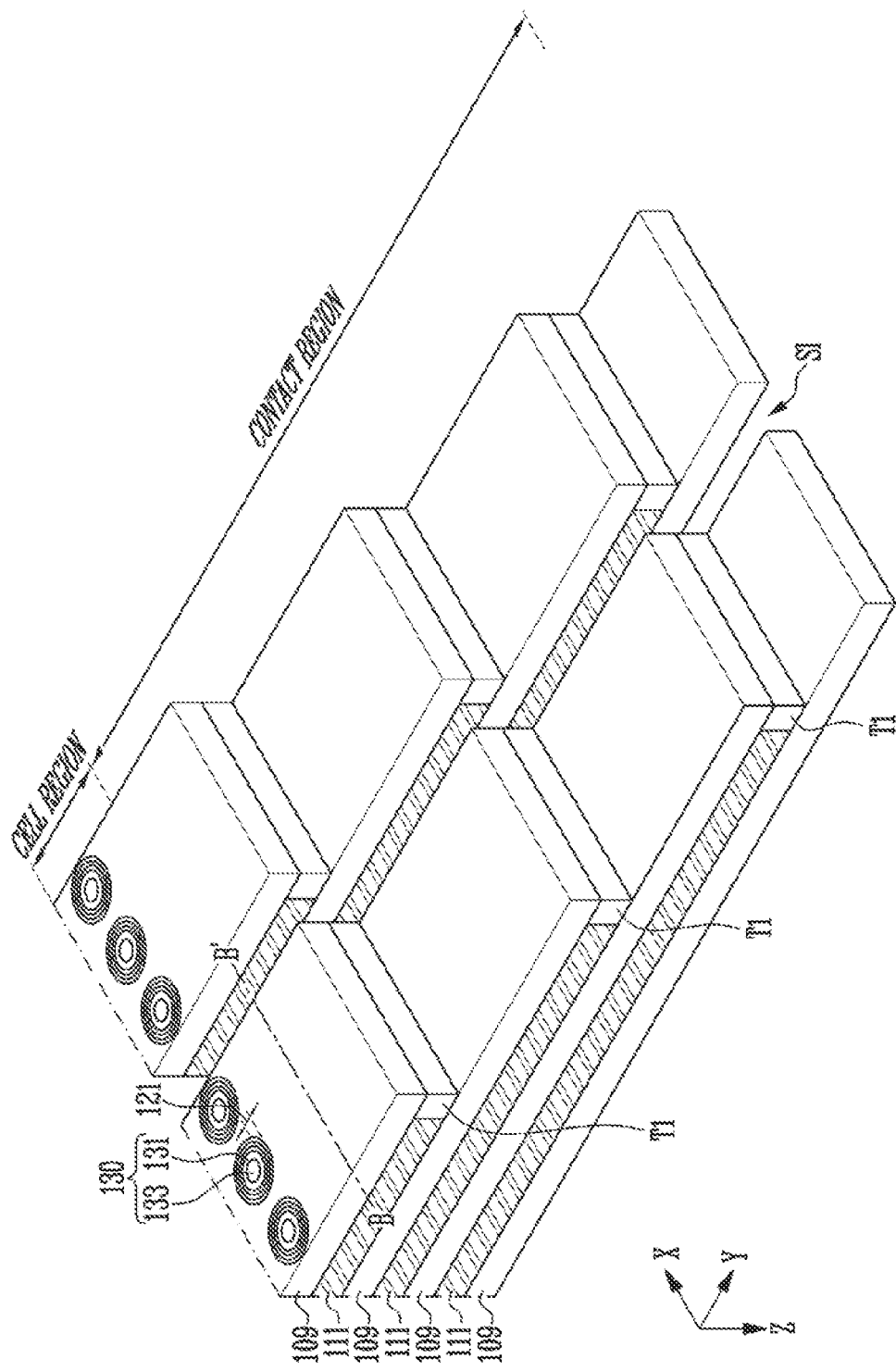

FIG. 12A is a plan view illustrating a first mask pattern MP1 formed on the entire structure formed through the process shown in FIG. 11. FIG. 12B is a perspective view illustrating a stack structure formed through an etching process using the first mask pattern MP1 shown in FIG. 12A.

Referring to FIGS. 12A and 12B, the first mask pattern MP1 in which a slit formation space OP is opened is formed on the entire structure formed through the process shown in FIG. 11. Subsequently, the gap fill insulating layer 143, the doped semiconductor layer 141, and the plurality of steps ST, which are shown in FIG. 11, are patterned through an etching process using the first mask pattern MP1. Therefore, a plurality of stepped structures are spaced apart from each other by a slit SI. The first tunnel T1 is disposed at an end portion of each of the sacrificial layers 111 to extend in a first direction X.

The doped semiconductor layer 141 is disposed on the top of the channel structure 130, and the gap fill insulating layer 143 is disposed on the top of the stepped structure. However, illustration of the doped semiconductor layer 141 and the gap fill insulating layer 143 is omitted for convenience of description.

Figure 13A:
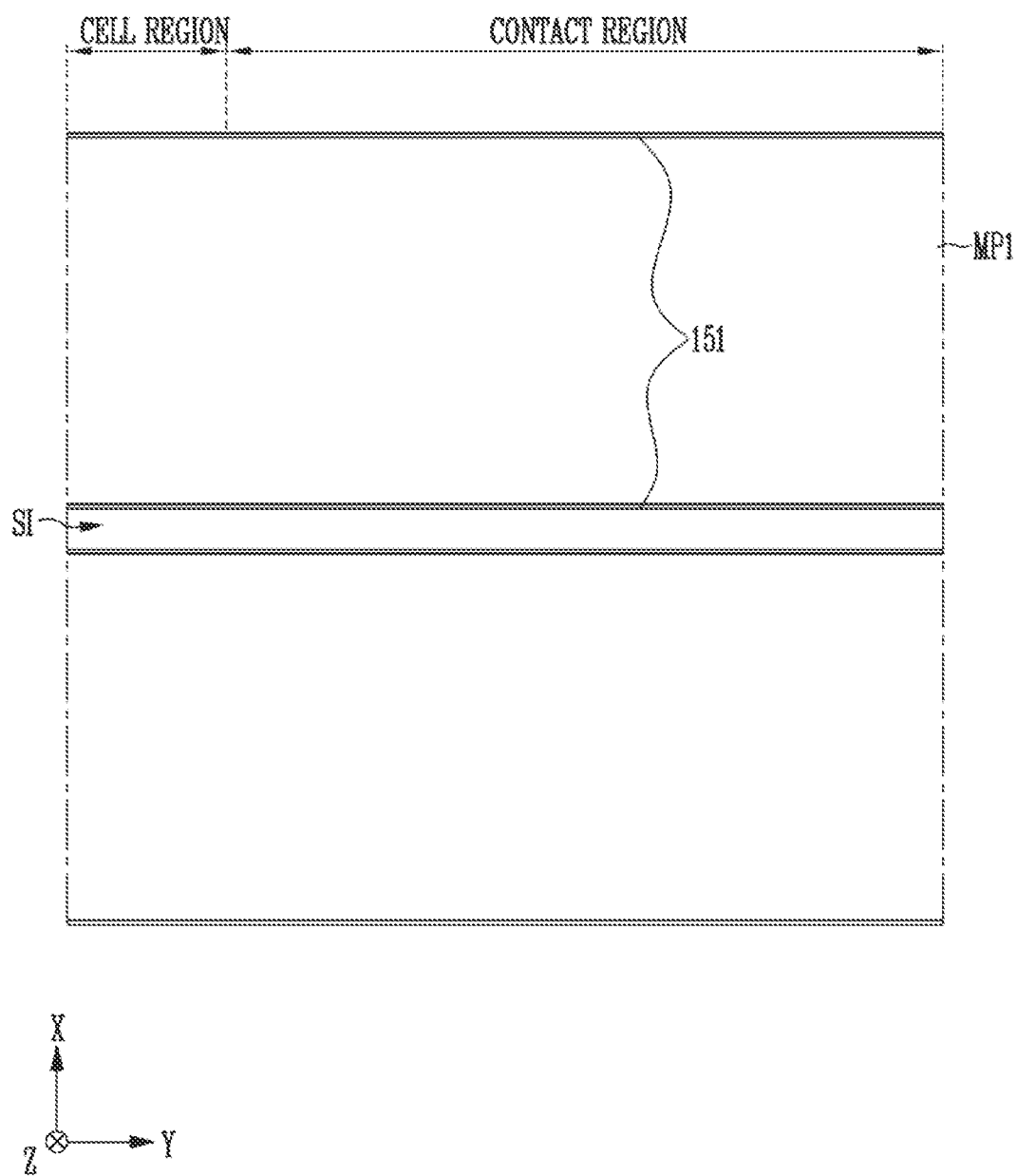
Figure 13B:
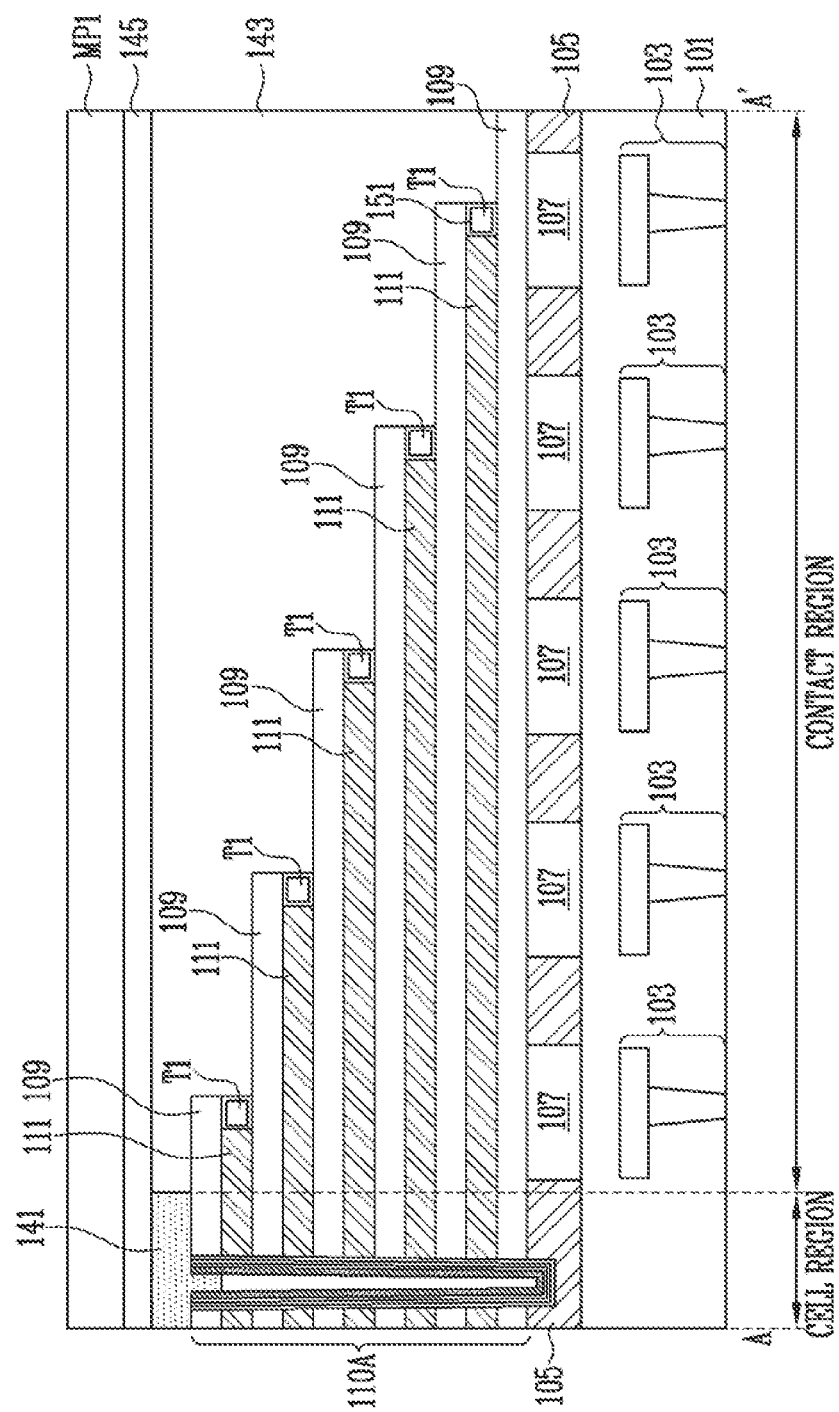

Referring to FIGS. 13A and 13B, after the process of forming the slit SI, a protective layer 151 is formed, which extends along an exposed sidewall of the slit SI and exposed internal surface of the first tunnel T1. The protective layer 151 may include a material having an etch selectivity with respect to the sacrificial layer 111. In an embodiment, the protective layer 151 may include at least one of poly-silicon, silicon germanium, and silicon carbon oxide. The protective layer 151 may prevent the sacrificial layer 111 on the contact region from being removed in a subsequent process of removing the sacrificial layer 111 on the cell region.

Figure 14:
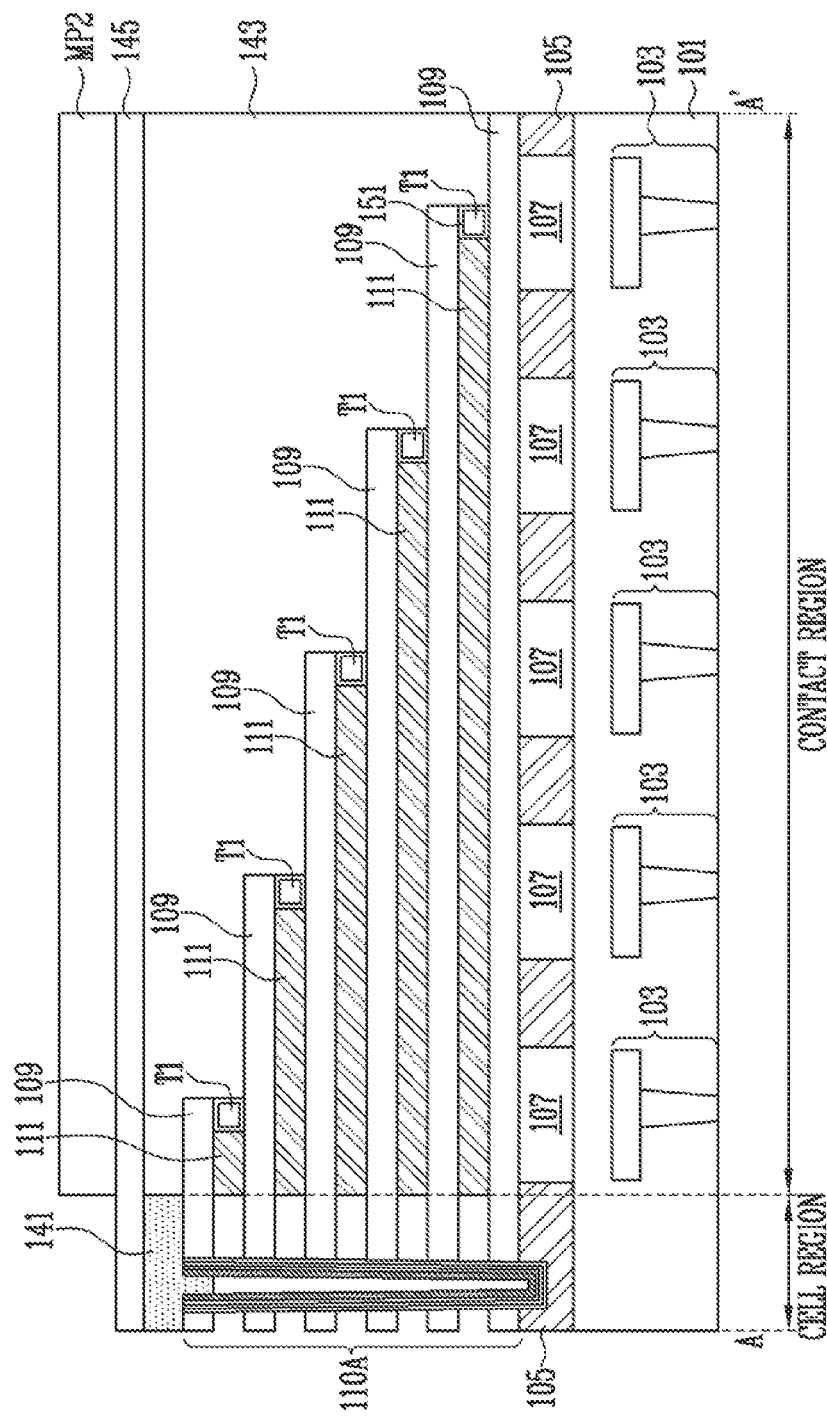

Referring to FIG. 14, the first mask pattern is removed, and a second mask pattern MP2 covering the top of the contact region is formed on the top of the insulating layer 145. The second mask pattern MP2 is formed such that the cell region is opened. Subsequently, the protective layer 151 formed on the cell region is removed by performing an etching process using the second mask pattern MP2. Therefore, a side surface of the sacrificial layer 111 formed on the cell region is exposed through the slit SI.

Subsequently, a space in which gate conductive patterns are to be formed is formed by removing the sacrificial layer 111 formed on the cell region through the etching process. Etching of the sacrificial layer 111 formed on the contact region is prevented by the protective layer 151. Therefore, the protective layer 151 remains on only the contact region.

Figure 15A:
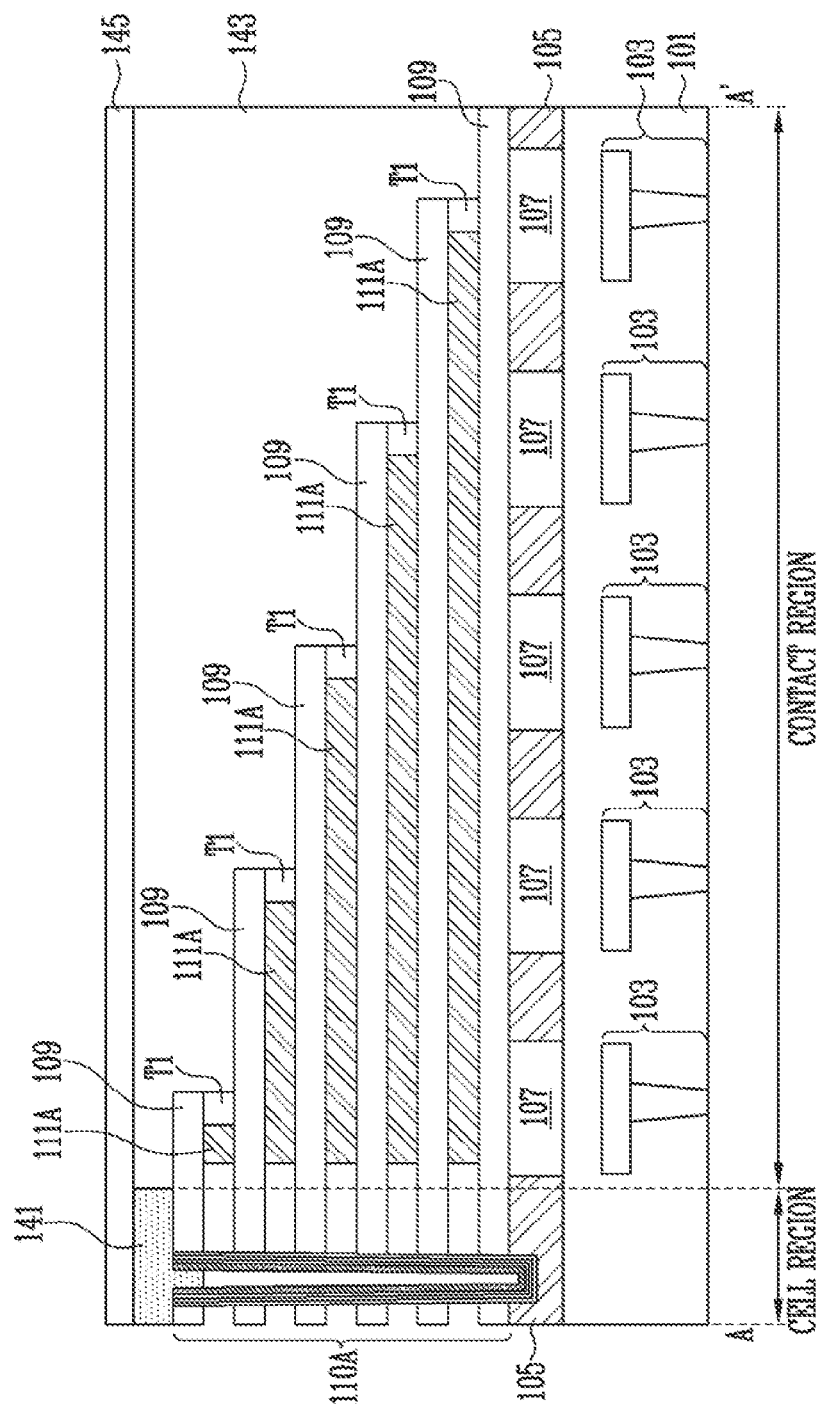

Referring to FIG. 15A, the second mask pattern is removed, and the protective layer formed on the contact region is removed. Therefore, a side surface of the sacrificial layer formed on the contact region is exposed through the slit SI.

Subsequently, an insulating pattern 111A is formed by etching, to a certain thickness, the sidewall of the sacrificial layer formed on the contact region through an etching process. For example, the sidewall of the sacrificial layer formed on the contact region may be etched to 50 nm to 100 nm.

Figure 15B:
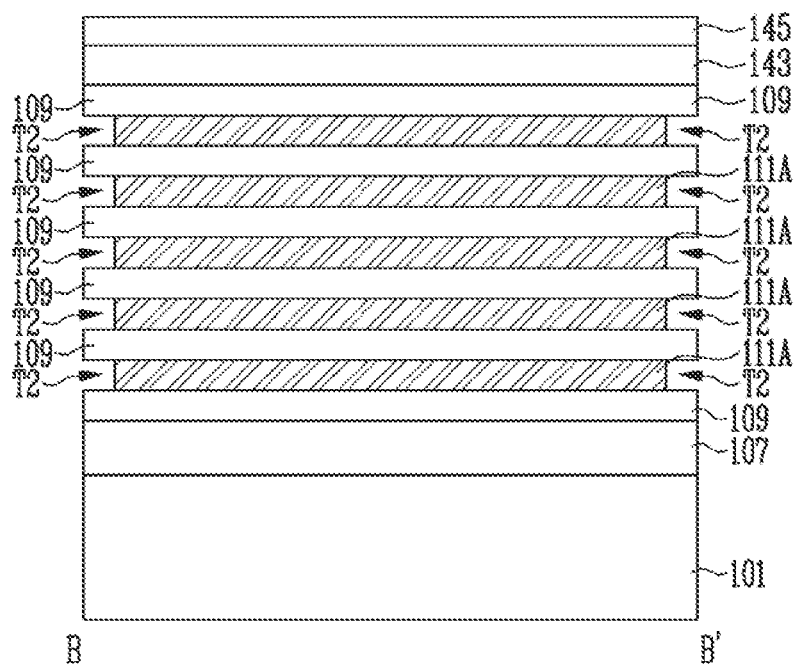

FIG. 15B is a sectional view taken along line B-B', illustrating a process of forming the insulating pattern 111A formed on the contact region, and the line B-B' illustrates a section taken along the first direction X, which is shown in FIG. 12B.

Referring to FIG. 15B, the insulating pattern 111A may be formed by etching, to a certain thickness, the sacrificial layer of which the sidewall is exposed through the slit, and second tunnels T2 may be formed at both end portions of the insulating patterns 111A. Second tunnels T2 disposed in the same layer may be connected to each other by the first tunnel T1 shown in FIG. 15A.

Figure 16A:
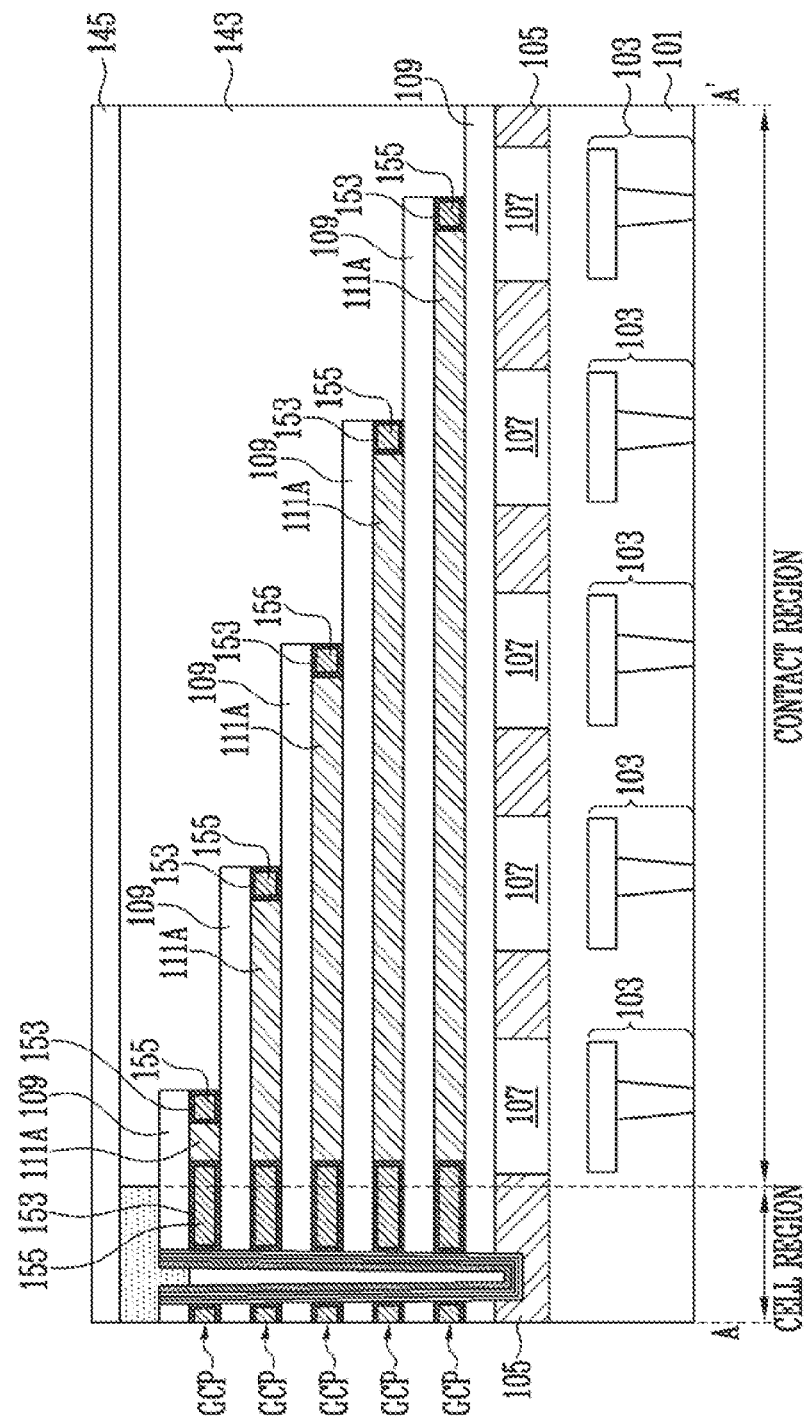

Referring to FIG. 16A, gate conductive patterns GCP are formed by sequentially forming a conductive barrier layer 153 and a metal layer 155 in spaces in which the gate conductive patterns on the cell region are to be formed and on internal surfaces of the first and second tunnels on the contact region. The conductive barrier layer 153 may be formed to surround the metal layer 155.

Figure 16B:
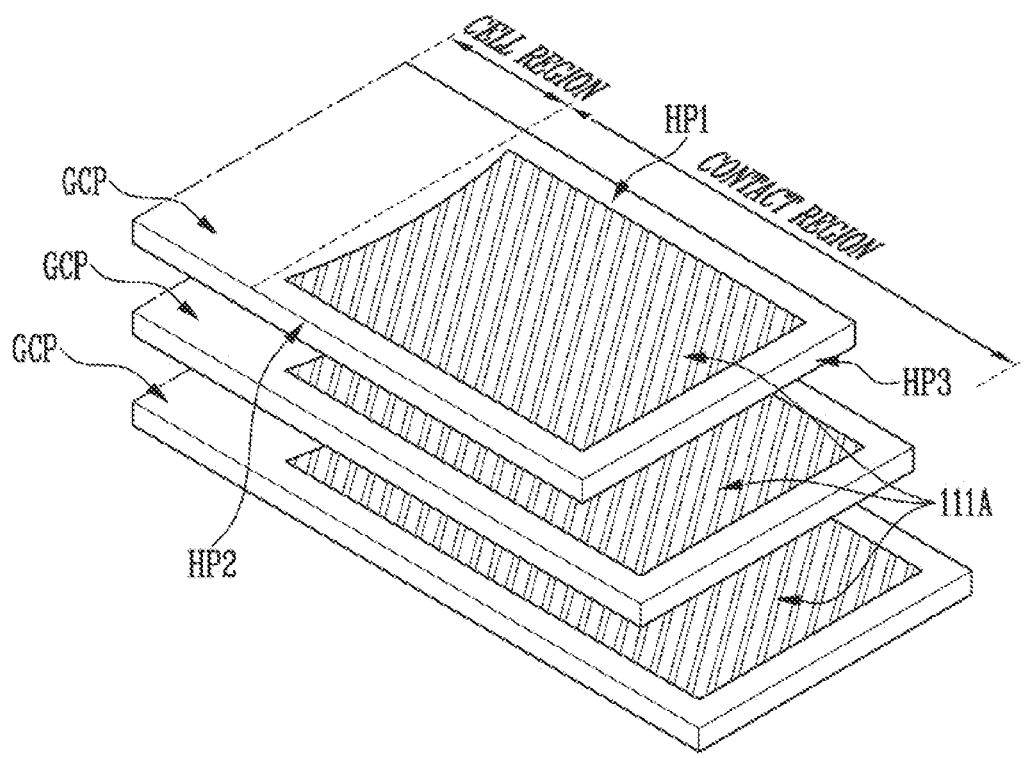

Referring to FIG. 16B, each of the gate conductive patterns GCP includes a first horizontal part HP1 and a second horizontal part HP2, which extend in parallel to each other from the cell region to the contact region, and one end portion of the first horizontal part HP1 and one end portion of the second horizontal part HP2 are connected to each other by a third horizontal part HP3. Also, the insulating pattern 111A is disposed in a space between the first horizontal part HP1 and the second horizontal part HP2 of each of the gate conductive patterns GCP.

Figure 17:
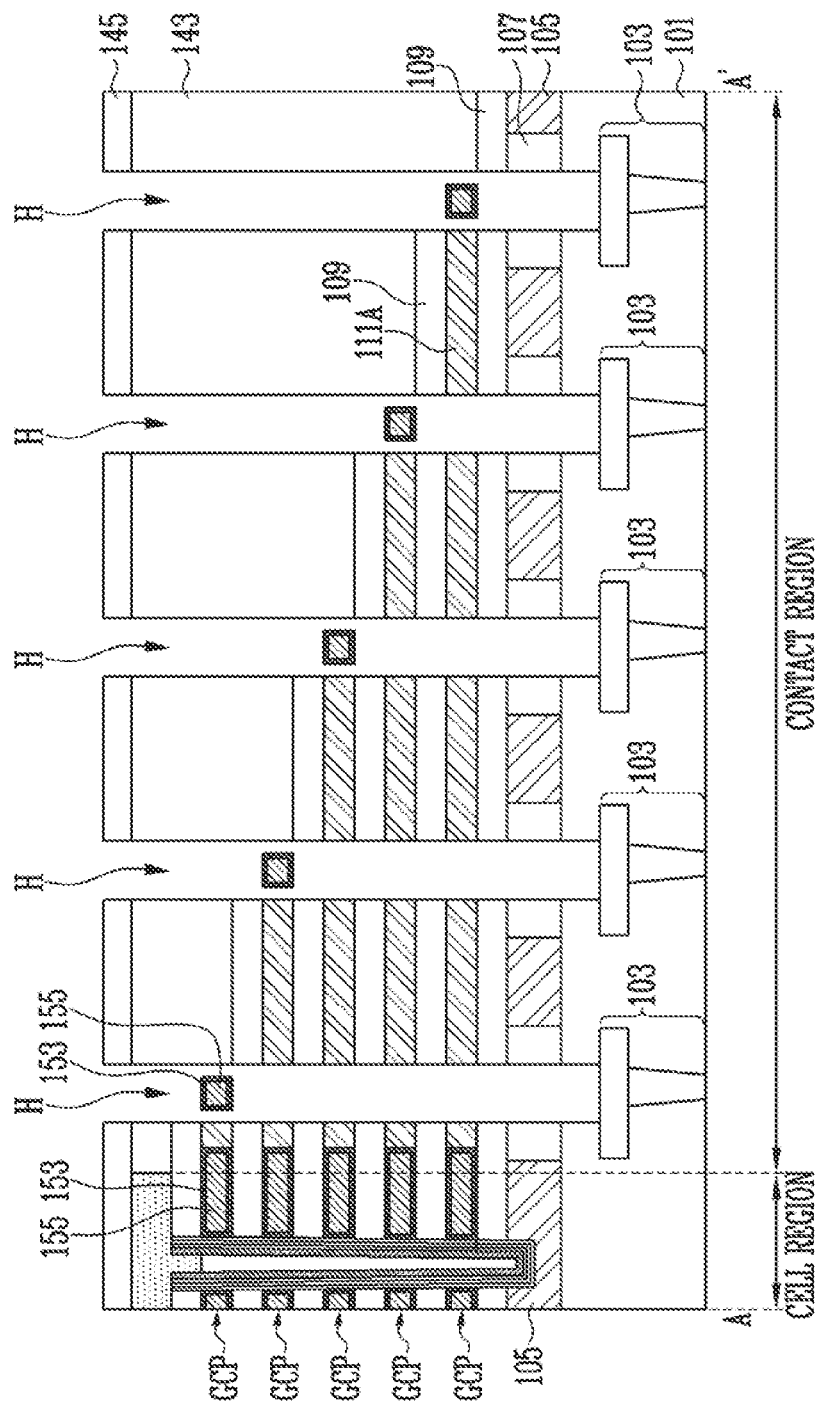

Referring to FIG. 17, a mask pattern (not shown) for forming contact holes H is formed on the insulating layer 145, and the contact holes H exposing upper surfaces of the interconnection structures 103 while penetrating the insulating layer 145, the gap fill insulating layer 143, the interlayer insulating layer 109, the insulating pattern 111A, the insulating layer 107, and the insulating structure 105 are formed by performing an etching process using the mask pattern.

Figure 18:
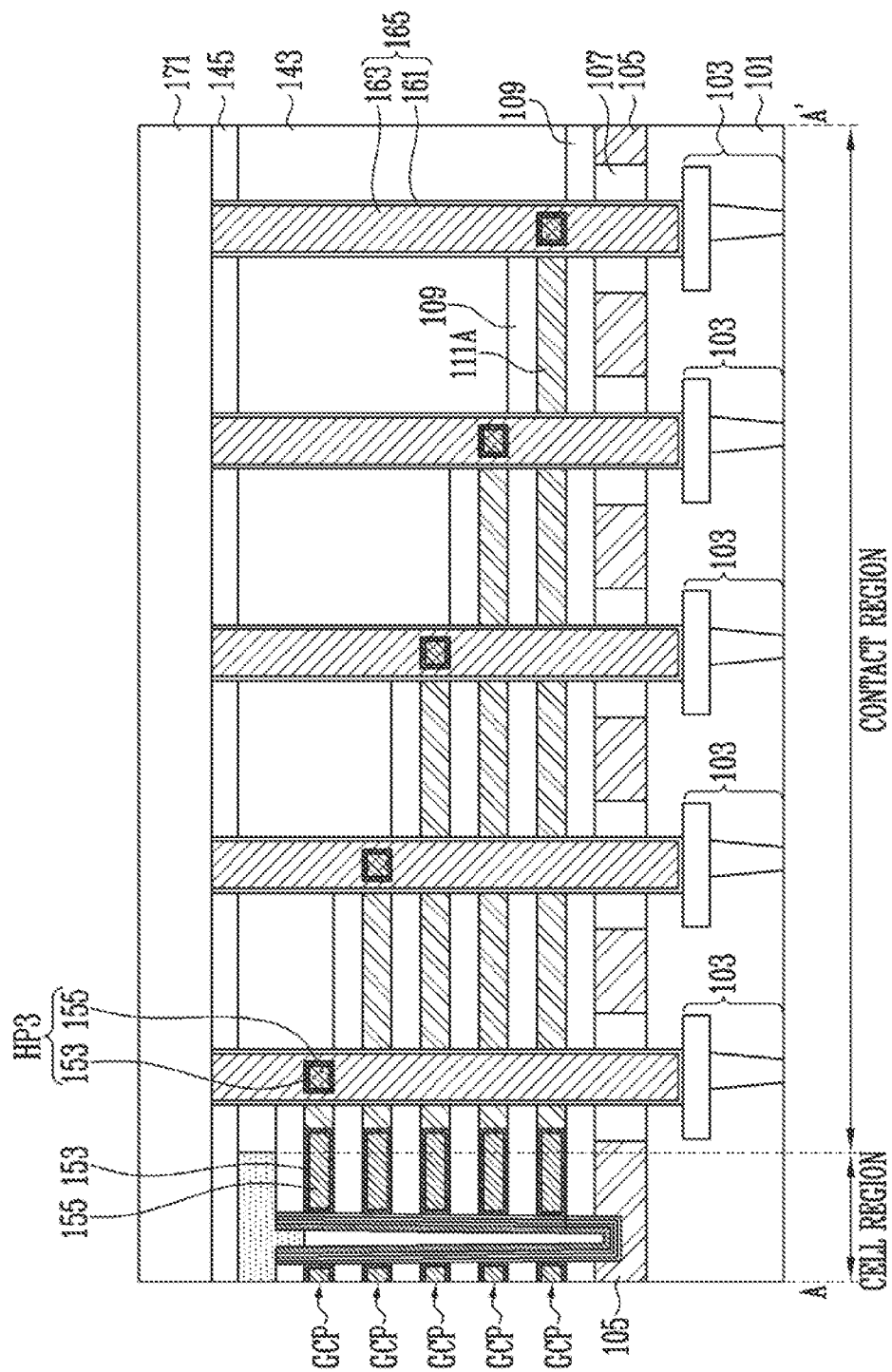

Referring to FIG. 18, a conductive barrier layer 161 is formed along sidewalls and bottom surfaces of the contact holes, and a conductive structure 163 is formed such that the contact holes are buried. Subsequently, gate contact structures 165 are formed in the contact holes by removing the mask pattern through a planarization such that the insulating layer 145 is exposed. The conductive barrier layer 161 is formed to surround a sidewall and a bottom surface of the conductive structure 163.

Each of the gate contact structures 165 penetrates the third horizontal part HP3 of a corresponding gate conductive pattern GCP. Therefore, each of the gate contact structures 165 is electrically and physically connected to a sidewall of the third horizontal part HP3 of a corresponding gate conductive pattern GCP.

Subsequently, a first upper insulating layer 171 is formed on the entire structure including the insulating layer 145 and the gate contact structures 165.

Figure 19:
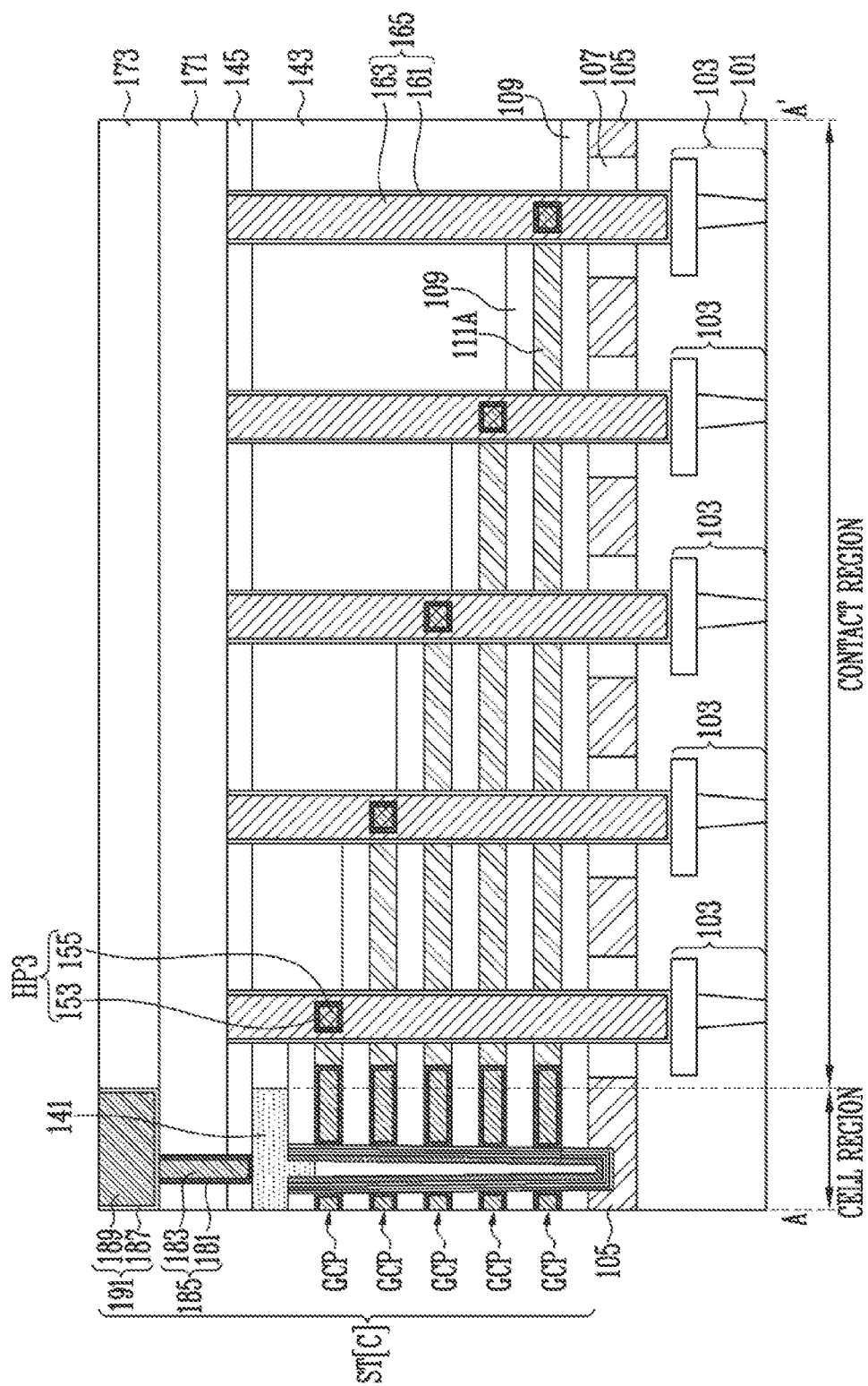

Referring to FIG. 19, a hole is formed by etching the first upper insulating layer 171 and the insulating layer 145 such that an upper surface of the doped semiconductor layer 141 is exposed, and a channel contact structure 185 is formed in the hole. The channel contact structure 185 may be formed by forming a conductive barrier layer 181 on a sidewall and a bottom surface of the hole and filling the hole with a conductive pattern 183.

Subsequently, a second upper insulating layer 173 is formed on the entire structure including the channel contact structure 185 and the first upper insulating layer 171. The second upper insulating layer 173 is etched to form a trench through which an upper portion of the channel contact structure 185 is exposed. Subsequently, an upper conductive layer 191 including a conductive barrier layer 187 and a conductive pattern 189 is formed in the trench of the second upper insulating layer 173. The conductive barrier layer 187 may extend along a sidewall and a bottom surface of the conductive pattern 189.

Figure 20:
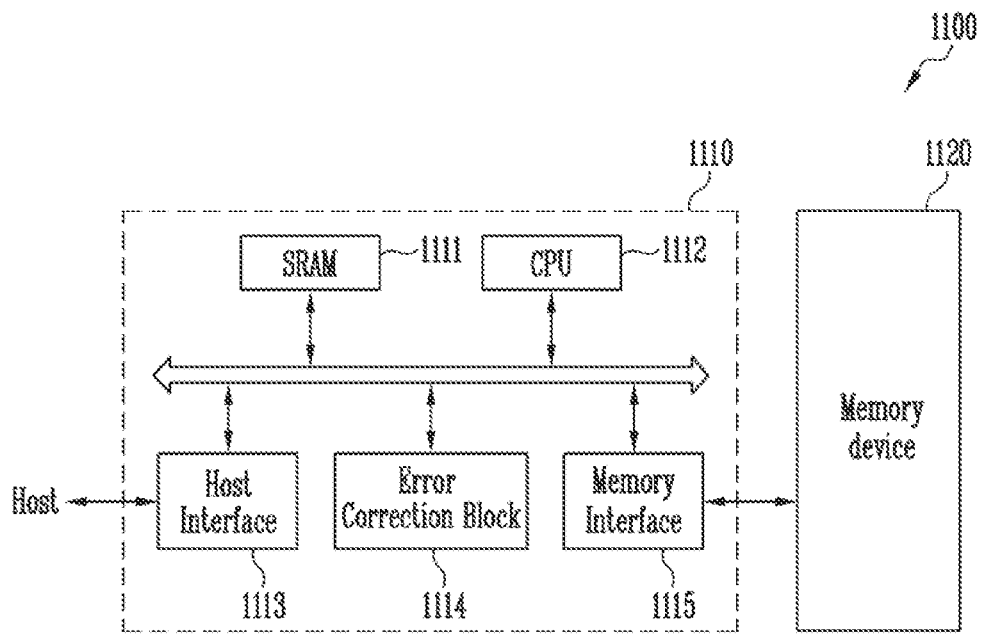
FIG. 20 is a block diagram illustrating a configuration of a memory system in accordance with an embodiment of the present disclosure.

FIG. 20 is a block diagram illustrating a configuration of a memory system 1100 in accordance with an embodiment of the present disclosure.

Referring to FIG. 20, the memory system 1100 includes a memory device 1120 and a memory controller 1110.

The memory device 1120 may be a multi-chip package configured with a plurality of flash memory chips. The memory device 1120 may include a peripheral circuit structure formed on a substrate and a stack structure formed on the peripheral circuit structure. The stack structure may include a cell stack structure. A gate contact structure connected to a gate conductive pattern of the cell stack structure may be connected to an interconnection structure included in the peripheral circuit structure while penetrating the cell stack structure.

The memory controller 1110 controls the memory device 1120, and may include a Static Random Access Memory (SRAM) 1111, a Central Processing Unit (CPU) 1112, a host interface 1113, an error correction block 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The error correction block 1114 detects and corrects an error included in a data read from the memory device 1120. The memory interface 1115 interfaces with the memory device 1120. The memory controller 1110 may further include a Read Only Memory (ROM) for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicated with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

Figure 21:
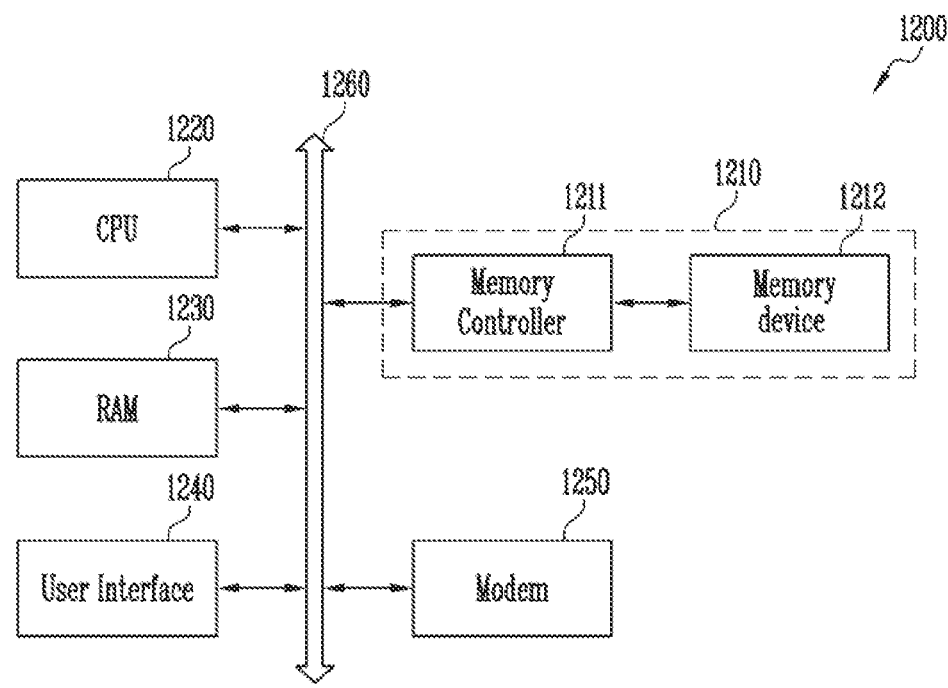
FIG. 21 is a block diagram illustrating a configuration of a computing system in accordance with an embodiment of the present disclosure.

FIG. 21 is a block diagram illustrating a configuration of a computing system 1200 in accordance with an embodiment of the present disclosure.

Referring to FIG. 21, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

The memory system 1210 may be configured with a memory device 1212 and a memory controller 1211. The memory device 1212 may be configured identically to the memory device 1120 described with reference to FIG. 20. The memory controller 1211 may be configured identically to the memory controller 1100 described with reference to FIG. 20.

In accordance with the present disclosure, a bridge phenomenon between conductive layers for word lines is prevented, and an additional metal line for connecting a peripheral circuit and a gate contact structure is unnecessary, so that a wiring process can be simplified. Further, the supporting force of gate conductive patterns in a contact region can be improved.

The examples of embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

What is claimed is:

1. A memory device comprising:
 a first gate conductive pattern disposed over a cell region and a contact region to extend horizontally from the cell region to the contact region, the first gate conductive pattern including a first horizontal part and a second horizontal part, which extend substantially in parallel to each other from the cell region to the contact region, and a third horizontal part connected to one end portion of the first horizontal part;
 a first insulating pattern disposed between the first horizontal part and the second horizontal part of the first gate conductive pattern;
 a second gate conductive pattern disposed substantially in parallel to the first gate conductive pattern under the first gate conductive pattern, the second gate conductive pattern including a first horizontal part and a second horizontal part, which extend substantially in parallel to each other from the cell region to the contact region, and a third horizontal part connected to one end portion of the first horizontal part of the second gate conductive pattern;
 a second insulating pattern disposed between the first horizontal part and the second horizontal part of the second gate conductive pattern;
 a first gate contact structure extending vertically over the contact region, the first gate contact structure being in contact with the first gate conductive pattern while penetrating the third horizontal part of the first gate conductive pattern; and
 a second gate contact structure extending vertically over the contact region, the second gate contact structure being in contact with the second gate conductive pattern while penetrating the third horizontal part of the second gate conductive pattern,
 wherein a length of the first gate conductive pattern extending to the contact region is shorter than that of the second gate conductive pattern extending to the contact region, and
 wherein the first gate conductive pattern surrounds only a sidewall of the first insulating pattern which is a single insulating pattern corresponding to the first gate conductive pattern and the second gate conductive pattern surrounds only a sidewall of the second insulating pattern which is a single insulating pattern corresponding to the second gate conductive pattern.

2. The memory device of claim 1, wherein one end portion of the second horizontal part of the first gate conductive pattern is connected to the third horizontal part of the first gate conductive pattern, and one end portion of the second horizontal part of the second gate conductive pattern is connected to the third horizontal part of the second gate conductive pattern.

3. The memory device of claim 1, wherein the first gate contact structure extends vertically while penetrating the second insulating pattern.

4. The memory device of claim 3, wherein the first gate contact structure is electrically and physically spaced apart from the second gate conductive pattern by the second insulating pattern.

5. The memory device of claim 1, further comprising an interlayer insulating layer formed between the first gate conductive pattern and the second gate conductive pattern.

6. The memory device of claim 1, wherein lengths of the first and second horizontal parts of the first gate conductive pattern are shorter than lengths of the first and second horizontal parts of the second gate conductive pattern.

\* \* \* \* \*